(12) United States Patent
Sherry et al.

(10) Patent No.: US 8,102,184 B2
(45) Date of Patent: Jan. 24, 2012

(54) TEST CONTACT SYSTEM FOR TESTING INTEGRATED CIRCUITS WITH PACKAGES HAVING AN ARRAY OF SIGNAL AND POWER CONTACTS

(75) Inventors: Jeffrey C. Sherry, Savage, MN (US); Patrick J. Alladio, Santa Rosa, CA (US); Russell F. Oberg, Beldenville, WI (US); Brian K. Warwick, Ben Lomond, CA (US)

(73) Assignee: Johnstech International, Minneapolis, MN (US)

( * ) Notice: Subject to any disclaimer, the term of this patent is extended or adjusted under 35 U.S.C. 154(b) by 752 days.

(21) Appl. No.: 12/199,457

(22) Filed: Aug. 27, 2008

(65) Prior Publication Data
US 2009/0302878 A1 Dec. 10, 2009

Related U.S. Application Data

(63) Continuation-in-part of application No. 11/623,887, filed on Jan. 17, 2007, now abandoned.

(60) Provisional application No. 60/759,459, filed on Jan. 17, 2006.

(51) Int. Cl.
*G01R 1/073* (2006.01)
(52) U.S. Cl. ......... 324/754.03; 324/754.13; 324/754.14; 324/755.02; 324/762.02
(58) Field of Classification Search .................. None
See application file for complete search history.

(56) References Cited

U.S. PATENT DOCUMENTS

| | | | |
|---|---|---|---|
| 4,655,519 A | 4/1987 | Evans et al. | |
| 5,479,110 A | 12/1995 | Crane et al. | |
| 5,812,378 A | 9/1998 | Fjelstad et al. | |
| 6,033,233 A | 3/2000 | Haseyama et al. | |
| 6,196,852 B1 * | 3/2001 | Neumann et al. | 439/66 |
| 6,246,249 B1 | 6/2001 | Fukasawa et al. | |
| 6,517,362 B2 * | 2/2003 | Hirai et al. | 439/82 |
| 7,307,293 B2 | 12/2007 | Fjelstad et al. | |
| 2001/0011907 A1 | 8/2001 | Farnworth et al. | |
| 2003/0192181 A1 | 10/2003 | Fjelstad et al. | |
| 2004/0201390 A1 | 10/2004 | Farnworth et al. | |
| 2006/0279300 A1 | 12/2006 | Khandros et al. | |
| 2007/0202714 A1 | 8/2007 | Sherry | |
| 2008/0096295 A1 | 4/2008 | Hasebe et al. | |

FOREIGN PATENT DOCUMENTS
EP 1808701 7/2007
EP 1488245 8/2007
* cited by examiner

*Primary Examiner* — Paresh Patel
(74) *Attorney, Agent, or Firm* — Altera Law Group, LLC

(57) ABSTRACT

A test fixture (120) is disclosed for electrically testing a device under test (130) by forming a plurality of temporary mechanical and electrical connections between terminals (131) on the device under test (130) and contact pads (161) on the load board (160). The test fixture (120) has a replaceable membrane (150) that includes vias (151), with each via (151) being associated with a terminal (131) on the device under test (130) and a contact pad (161) on the load board (160). In some cases, each via (151) has an electrically conducting wall for conducting current between the terminal (131) and the contact pad (161). In some cases, each via (151) includes a spring (152) that provides a mechanical resisting force to the terminal (131) when the device under test (130) is engaged with the test fixture (120).

57 Claims, 18 Drawing Sheets

TEST CONTACT SYSTEM FOR TESTING INTEGRATED CIRCUITS WITH PACKAGES HAVING AN ARRAY OF SIGNAL AND POWER CONTACTS

CROSS-REFERENCE TO RELATED APPLICATIONS

This application is a continuation-in-part of U.S. application Ser. No. 11/623,887, filed Jan. 17, 2007 now abandoned under the same title, and published on Aug. 30, 2007 as Pub. No. US 2007/0202714 A1, which claimed priority under 35 U.S.C. §119(e) to provisional application No. 60/759,459, filed on Jan. 17, 2006. Full Paris Convention priority is hereby expressly reserved.
See MPEP 201.11 III

STATEMENT REGARDING FEDERALLY SPONSORED RESEARCH OR DEVELOPMENT

Not Applicable

BACKGROUND OF THE INVENTION

1. Field of the Invention

The present invention is directed to equipment for testing microcircuits.

2. Description of the Related Art

The invention pertains to improvements to equipment for testing microcircuits. The manufacturing processes for microcircuits cannot guarantee that every microcircuit is fully functional. Dimensions of individual microcircuits are microscopic and process steps very complex, so small or subtle failures in a manufacturing process can often result in defective devices.

Mounting a defective microcircuit on a circuit board is relatively costly. Installation usually involves soldering the microcircuit onto the circuit board. Once mounted on a circuit board, removing a microcircuit is problematic because the very act of melting the solder for a second time ruins the circuit board. Thus, if the microcircuit is defective, the circuit board itself is probably ruined as well, meaning that the entire value added to the circuit board at that point is lost. For all these reasons, a microcircuit is usually tested before installation on a circuit board.

Each microcircuit must be tested in a way that identifies all defective devices, but yet does not improperly identify good devices as defective. Either kind of error, if frequent, adds substantial overall cost to the circuit board manufacturing process.

Microcircuit test equipment itself is quite complex. First of all, the test equipment must make accurate and low resistance temporary and non-destructive electrical contact with each of the closely spaced microcircuit contacts. Because of the small size of microcircuit contacts and the spacings between them, even small errors in making the contact will result in incorrect connections. Connections to the microcircuit that are misaligned or otherwise incorrect will cause the test equipment to identify the device under test (DUT) as defective, even though the reason for the failure is the defective electrical connection between the test equipment and the DUT rather than defects in the DUT itself A further problem in microcircuit test equipment arises in automated testing. Testing equipment may test 100 devices a minute, or even more. The sheer number of tests cause wear on the tester contacts making electrical connections to the microcircuit terminals during testing. This wear dislodges conductive debris from both the tester contacts and the DUT terminals that contaminates the testing equipment and the DUTs themselves.

The debris eventually results in poor electrical connections during testing and false indications that the DUT is defective. The debris adhering to the microcircuits may result in faulty assembly unless the debris is removed from the microcircuits. Removing debris adds cost and introduces another source of defects in the microcircuits themselves.

Other considerations exist as well. Inexpensive tester contacts that perform well are advantageous. Minimizing the time required to replace them is also desirable, since test equipment is expensive. If the test equipment is off line for extended periods of normal maintenance, the cost of testing an individual microcircuit increases.

Test equipment in current use has an array of test contacts that mimic the pattern of the microcircuit terminal array. The array of test contacts is supported in a structure that precisely maintains the alignment of the contacts relative to each other. An alignment template or board aligns the microcircuit itself with the test contacts. The test contacts and the alignment board are mounted on a load board having conductive pads that make electrical connection to the test contacts. The load board pads are connected to circuit paths that carry the signals and power between the test equipment electronics and the test contacts.

So-called "Kelvin" testing refers to a process where each microcircuit terminal contacts two test contacts. A preliminary part of the test procedure measures the resistance between the two test contacts. If this value is high, one or both of the two test contacts are not making good electrical contact to the microcircuit terminal. If the possibility of high resistance at this interface will affect the accuracy of the actual testing of the microcircuit performance, then the issue can be addressed according to the provisions of the testing protocol.

In the appended drawings, the form factors for the various components shown are not to scale where it may make it easier for the reader to understand the invention. Where relevant or helpful, the description includes representative dimensions.

One particular type of microcircuit often tested before installation has a package or housing having what is commonly referred to as a ball grid array (BGA) terminal arrangement. FIGS. 1 and 2 show an example of a BGA package type of microcircuit 10. Such a package may have the form of a flat rectangular block, with typical sizes ranging from 5 mm to 40 mm on a side and 1 mm thick.

FIG. 1 shows microcircuit 10 with a housing 13 enclosing the actual circuitry. Signal and power (S&P) terminals 20 are on one of the two larger, flat surfaces, surface 14, of housing 13. Signal and power (S&P) terminals 20 surround a projection 16 on surface 14. Typically, terminals 20 occupy most of the area between the surface 14 edges and spacer 16 rather than only a portion of the area as is shown in FIG. 1. Note that in some cases, spacer 16 may be an encapsulated chip or a ground pad.

FIG. 2 shows an enlarged side or elevation view of terminals 20 as they appear with surface 14 on edge. Each of the terminals 20 includes a small, approximately spherical solder ball that firmly adheres to a lead from the internal circuitry penetrating surface 14, hence the term "ball grid assembly." FIG. 2 shows each terminal 20 and spacer 16 projecting small distances away from surface 14, with the terminals 20 projecting farther from surface 14 than the spacers 16. During assembly, all terminals 20 are simultaneously melted, and adhere to suitably located conductors previously formed on the circuit board.

Terminals 20 may be quite close to each other. Some have centerline spacings of as little as 0.5 mm, and even relatively widely spaced terminals 20 are still around 1.5 mm apart. Spacing between adjacent terminals 20 is often referred to as "pitch."

In addition to the factors mentioned above, BGA microcircuit testing involves additional factors.

First, in making the temporary contact with the ball terminals 20, the tester should not scratch or otherwise mark the S&P terminal surfaces that contact the circuit board, since such a mark may affect the reliability of the solder joint for that terminal.

Second, the testing process is more accurate if the length of the conductors carrying the signals is kept short. An ideal test contact arrangement has short signal paths.

Third, solders commonly in use today for BGA terminals are mainly tin for environmental purposes. Tin-based solder alloys are likely to develop an oxide film on the outer surface that conducts poorly. Older solder alloys include substantial amounts of lead, which do not form oxide films. The test contacts must be able to penetrate the oxide film present.

BGA test contacts currently known and used in the art employ spring pins made up of multiple pieces including a spring, a body and top and bottom plungers.

United States Patent Application Publication No. US 2003/0192181 A1, titled "Method of making an electronic contact" and published on Oct. 16, 2003, shows microelectronic contacts, such as flexible, tab-like, cantilever contacts, which are provided with asperities disposed in a regular pattern. Each asperity has a sharp feature at its tip remote from the surface of the contact. As mating microelectronic elements are engaged with the contacts, a wiping action causes the sharp features of the asperities to scrape the mating element, so as to provide effective electrical interconnection and, optionally, effective metallurgical bonding between the contact and the mating element upon activation of a bonding material.

According to United States Patent Application Publication No. US 2004/0201390 A1, titled "Test interconnect for bumped semiconductor components and method of fabrication" and published on Oct. 14, 2004, an interconnect for testing semiconductor components includes a substrate, and contacts on the substrate for making temporary electrical connections with bumped contacts on the components. Each contact includes a recess and a pattern of leads cantilevered over the recess configured to electrically engage a bumped contact. The leads are adapted to move in a z-direction within the recess to accommodate variations in the height and planarity of the bumped contacts. In addition, the leads can include projections for penetrating the bumped contacts, a non-bonding outer layer for preventing bonding to the bumped contacts, and a curved shape which matches a topography of the bumped contacts. The leads can be formed by forming a patterned metal layer on the substrate, by attaching a polymer substrate with the leads thereon to the substrate, or by etching the substrate to form conductive beams.

According to U.S. Pat. No. 6,246,249 B1, titled "Semiconductor inspection apparatus and inspection method using the apparatus" and issued on Jun. 12, 2001 to Fukasawa, et al., a semiconductor inspection apparatus performs a test on a to-be-inspected device which has a spherical connection terminal. This apparatus includes a conductor layer formed on a supporting film. The conductor layer has a connection portion. The spherical connection terminal is connected to the connection portion. At least a shape of the connection portion is changeable. The apparatus further includes a shock absorbing member, made of an elastically deformable and insulating material, for at least supporting the connection portion. A test contact element of the invention for making temporary electrical contact with a microcircuit terminal comprises at least one resilient finger projecting from an insulating contact membrane as a cantilevered beam. The finger has on a contact side thereof, a conducting contact pad for contacting the microcircuit terminal.

In U.S. Pat. No. 5,812,378, titled "Microelectronic connector for engaging bump leads" and issued on Sep. 22, 1998 to Fjelstad, et al., a connector for microelectronic includes a sheet-like body having a plurality of holes, desirably arranged in a regular grid pattern. Each hole is provided with a resilient laminar contact such as a ring of a sheet metal having a plurality of projections extending inwardly over the hole of a first major surface of the body. Terminals on a second surface of the connector body are electrically connected to the contacts. The connector can be attached to a substrate such a multi-layer circuit panel so that the terminals on the connector are electrically connected to the leads within the substrate. Microelectronic elements having bump leads thereon may be engaged with the connector and hence connected to the substrate, by advancing the bump leads into the holes of the connector to engage the bump leads with the contacts. The assembly can be tested, and if found acceptable, the bump leads can be permanently bonded to the contacts. According to United States Patent Application Publication No. US 2001/0011907 A1, titled "Test interconnect for bumped semiconductor components and method of fabrication" and published on Aug. 9, 2001, an interconnect for testing semiconductor components includes a substrate, and contacts on the substrate for making temporary electrical connections with bumped contacts on the components. Each contact includes a recess and a support member over the recess configured to electrically engage a bumped contact. The support member is suspended over the recess on spiral leads formed on a surface of the substrate. The spiral leads allow the support member to move in a z-direction within the recess to accommodate variations in the height and planarity of the bumped contacts. In addition, the spiral leads twist the support member relative to the bumped contact to facilitate penetration of oxide layers thereon. The spiral leads can be formed by attaching a polymer substrate with the leads thereon to the substrate, or by forming a patterned metal layer on the substrate. In an alternate embodiment contact, the support member is suspended over the surface of the substrate on raised spring segment leads.

BRIEF SUMMARY OF THE INVENTION

The aspect directed to a test contact system for testing integrated circuits with packages having an array of signal and power contacts and alleviating the problem of debris on the contacts.

The connection vias test receptacle in some applications may have a cup shape with an open end, with the open end of the cup-shaped via contacting the aligned test contact element. Therefore, debris resulting from loading and unloading devices under test from the test equipment can fall through the test contact elements where the cup-shaped vias impound the debris.

The contact and interface membranes may be used as part of a test receptacle including a load board. The load board has a plurality of connection pads in substantially the predetermined pattern of the test contacts elements. The load board supports the interface membrane with each of the connection pads on the load board substantially aligned with one of the connection vias and in electrical contact therewith.

The structure of the device may provide a wiping function during testing on the sides of the ball terminals rather than the end that will contact the circuit board, while also providing very good electrical contact. The wiping function usually breaks through any oxide layers present on terminals. Each test contact has a hole in the middle of the contact surface, so the end of the terminal is not marked during testing. This is particularly useful for lead-free terminals which tend to create thicker oxide layers. The vias that connect the test contact elements to the load board can be modified with springs to allow for microcircuit packages that do not have coplanar terminals and to provide Z axis compliance.

An embodiment is a test receptacle for making temporary electrical contact with a plurality of microcircuit terminals having a predetermined pattern, comprising: a test contact element array comprising a plurality of test contact elements arranged in substantially the predetermined pattern of the plurality of microcircuit terminals, each test contact element in the plurality comprising a resilient finger projecting from an insulating membrane as a cantilevered beam, and having on a contact side thereof a conducting contact pad for contacting a corresponding microcircuit terminal in the plurality; a plurality of connection vias arranged in substantially the predetermined pattern of the plurality of microcircuit terminals, each connection via in the plurality aligned with one of the test contact elements; an interface membrane supporting the plurality of connection vias. At least one of the connection vias (83-85) is cup-shaped with an open end, with the open end of the cup-shaped via (83-85) contacting a corresponding test contact element (56-58).

Another embodiment is a test fixture for forming a plurality of temporary mechanical and electrical connections between a device under test having a plurality of terminals and a load board having a plurality of connection pads, the terminals and connection pads being in a one-to-one correspondence, comprising: a replaceable interface membrane disposed generally parallel to and adjacent to the load board, the interface membrane including a plurality of vias in a one-to-one correspondence with the plurality of connection pads of the load board, each via being cup-shaped with a base adjacent to a corresponding connection pad on the load board and a rim extending away from the load board; and a replaceable contact membrane disposed generally parallel to and adjacent to the interface membrane, the interface membrane being between the load board and the contact membrane, the contact membrane including a plurality of connection pads facing the interface membrane, each via on the interface membrane corresponding to at least one connection pad on the contact membrane, the contact membrane including a plurality of contact pads facing away from the interface membrane, each contact pad in the plurality being permanently electrically connected to at least one of the plurality of connection pads, each via on the interface membrane corresponding to at least one contact pad on the contact membrane. Each contact pad corresponding to a particular via is configured to mechanically and electrically receive the terminal on the device under test corresponding to the particular via. When the device under test is attached to the test fixture, the interface membrane contacts the load board, the contact membrane contacts the interface membrane, and the plurality of terminals on the device under test are electrically connected in a one-to-one correspondence to the plurality of connection pads on the load board.

A further embodiment is a test fixture for forming a plurality of temporary mechanical and electrical connections between a device under test and a load board, comprising: a membrane for mechanically and electrically contacting the load board; a plurality of vias disposed in the membrane, each via in the plurality being associated with a terminal on the device under test and a contact pad on the load board, each via in the plurality having an electrically conducting wall for conducting current between the terminal and the contact pad; and a plurality of springs disposed within the plurality of vias in a one-to-one correspondence, each spring in the plurality providing a mechanical resisting force to the terminal when the device under test is engaged with the test fixture.

A still further embodiment is a test fixture for forming a plurality of temporary mechanical and electrical connections between a device under test and a load board, comprising: a membrane for mechanically and electrically contacting the load board; a plurality of vias disposed in the membrane, each via in the plurality being associated with a terminal on the device under test and a contact pad on the load board; a plurality of springs disposed within the plurality of vias in a one-to-one correspondence, each spring in the plurality providing a mechanical resisting force to the terminal when the device under test is engaged with the test fixture; and a pair of open-ended tubes, the open end of one tube fitting within the open end of the other tube, the tubes being longitudinally slidable with respect to each other, the tubes surrounding and housing the spring.

A still even further embodiment is a test fixture for forming a plurality of temporary mechanical and electrical connections between a device under test and a load board, comprising: a membrane for mechanically and electrically contacting the load board; a plurality of vias disposed in the membrane, each via in the plurality being associated with a terminal on the device under test and a contact pad on the load board; a plurality of springs disposed within the plurality of vias in a one-to-one correspondence, each spring in the plurality providing a mechanical resisting force to the terminal when the device under test is engaged with the test fixture; and an electrically conducting ribbon for conducting current between the terminal and the contact pad, the ribbon including at least one strand interwoven with the spring and electrically connecting a first longitudinal end of the spring to a second longitudinal end opposite the first longitudinal end.

DETAILED DESCRIPTION OF THE INVENTION

Figure 1:
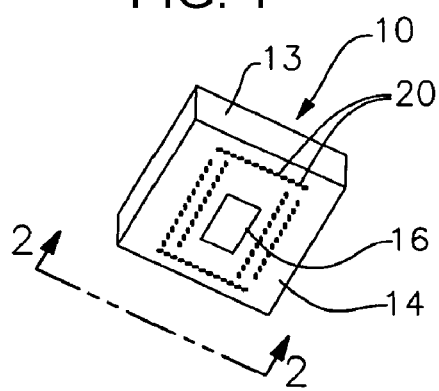
FIG. 1 is a perspective view of a BGA microcircuit showing the terminals array.

A test contact element for making temporary electrical contact with a microcircuit terminal comprises at least one resilient finger projecting from an insulating contact membrane as a cantilevered beam. The finger has on a contact side thereof, a conducting contact pad for contacting the microcircuit terminal.

Preferably the test contact element has a plurality of fingers, which may advantageously have a pie-shaped arrangement. In such an arrangement, each finger is defined at least in part by two radially oriented slots in the membrane that mechanically separate each finger from every other finger of the plurality of fingers forming the test contact element.

A plurality of the test contact elements can form a test contact element array comprising the test contact elements arranged in a predetermined pattern. A plurality of connection vias are arranged in substantially the predetermined pattern of the test contacts elements, with each of said connection vias is aligned with one of the test contact elements. Preferably, an interface membrane supports the plurality of connection vias in the predetermined pattern. Numerous vias can be embedded into the pie pieces away from the device contact area to increase life. Slats separating fingers could be plated to create an I-beam, thereby preventing fingers from deforming, and also increasing life.

The connection vias may have a cup shape with an open end, with the open end of the cup-shaped via contacting the aligned test contact element. Debris resulting from loading and unloading DUTs from the test equipment can fall through the test contact elements where the cup-shaped vias impound the debris.

The contact and interface membranes may be used as part of a test receptacle including a load board. The load board has a plurality of connection pads in substantially the predetermined pattern of the test contacts elements. The load board supports the interface membrane with each of the connection pads on the load board substantially aligned with one of the connection vias and in electrical contact therewith.

This device uses a very thin conductive plate with retention properties that adheres to a very thin non-conductive insulator. The metal portion of the device provides multiple contact points or paths between the contacting I/O and the load board. This can be done either with a plated via hole housing or with plated through hole vias, or bumped surfaces, possibly in combination with springs, that has the first surface making contact with the second surface, i.e., the device I/O.

The device I/O may be physically close to the load board, thus improving electrical performance. In addition the present device also provides compliance thus allowing its use in both manual and automated test equipment.

The device's structure provides a wiping function during testing on the sides of the ball terminals rather than the end that will contact the circuit board, while also providing very good electrical contact. The wiping function usually breaks through any oxide layers present on terminals 20. Each test contact has a hole in the middle of the contact surface, so the end of the terminal 20 is not marked during testing. A by-product is to self-align device to contact pads on the membrane. This is particularly useful for lead-free terminals which tend to create thicker oxide layers. The vias that connect the test contact elements to the load board can be modified with springs to allow for microcircuit packages that do not have coplanar terminals and to provide additional Z axis compliance.

The device is compatible with terminals 20 having fine pitch and could be easily used to interconnect to die or wafers. The concept has been successful for terminals with pitch from 1.27 mm down to 0.5 mm. The non-conductive material holds the conductive portion of the design in place and aligns the package, die, and wafer I/O on any of the alternatives mentioned above.

Figure 2:
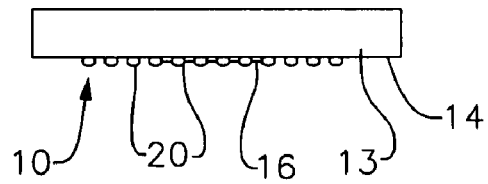
FIG. 2 is an enlarged side elevation view of a BGA microcircuit.
Figure 3:
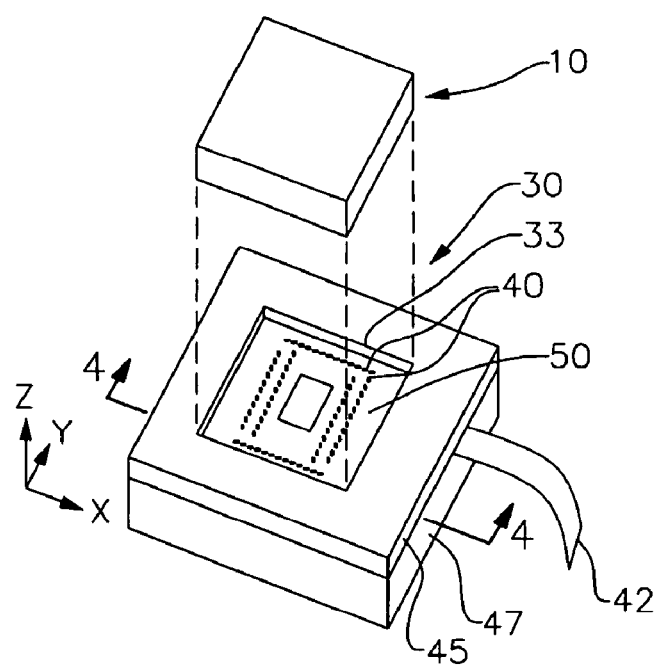
FIG. 3 is a perspective view of a part of the test equipment having a DUT well for receiving the DUT for testing.

FIG. 3 shows the general arrangement of a test receptacle 30 for a DUT that includes a BGA type microcircuit 10 of the type shown in FIGS. 1 and 2. A load board 47 supports an alignment plate 45 having an opening or aperture 33 that precisely defines the X and Y (see the coordinate indicator) positioning of the microcircuit 10 in receptacle 30. If microcircuit 10 has orientation features, it is common practice to include cooperating features in aperture 33.

Load board 47 carries on its surface, connection pads connected to a cable 42 by S&P conductors. Cable 42 connects to the electronics that perform that electrical testing of microcircuit 10. Cable 42 may be very short or even internal to receptacle 30 if the test electronics are integrated with receptacle 30, or longer if the test electronics are on a separate chassis.

A test contact array 40 having a number of individual test contact elements precisely mirrors the BGA terminals 20 carried on surface 14 of microcircuit 10. When microcircuit 10 is inserted in aperture 33, terminals 20 precisely align with test contact array 40. Receptacle 30 is designed for compatibility with a test contact array 40 incorporating the device.

Test contact array 40 is carried on a contact membrane or sheet 50. Membrane 50 initially includes an insulating plastic core layer 61 (see FIG. 6) such as Kapton™ (DuPont Corp.) with a layer of conductive copper on each surface. The Kapton layer and the copper layers may each be on the order of 25 microns thick. Individual test contacts in array 40 are preferably formed on and in membrane 50 using well-known photolithographic and laser machining processes.

Membrane 50 has alignment features such as holes or edge patterns located in the area between alignment plate 45 and load board 47 that provide for precise alignment of membrane 50 with corresponding projecting features on alignment plate 47. All of the test contacts 40 are in precise alignment with the membrane 50 alignment features. In this way, the test contacts of array 40 are placed in precise alignment with aperture 33.

Figure 4:
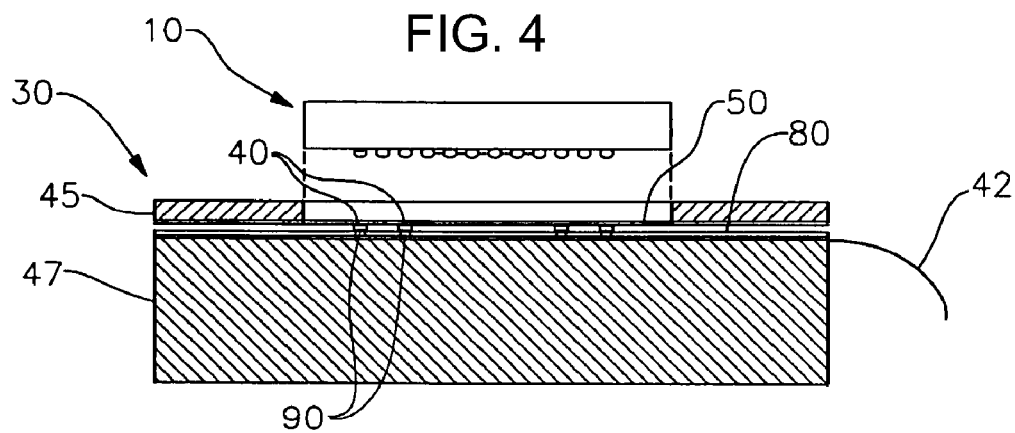
FIG. 4 is a side elevation cross section of the test equipment of FIG. 3.

The section view of FIG. 4 shows the general arrangement of test receptacle 30 with membrane 50 on edge, and with the section plane passing through some of the test contacts of array 40. The individual elements are slightly spaced in FIG. 4 so as to allow better understanding of the structure. When configured for use, the upper surface of membrane 50 contacts the lower surface of alignment plate 45, with all the elements of receptacle 30 held firmly together by machine screws or other fasteners.

The lower surface of membrane 50 mechanically contacts an interface membrane 80 of a special design. Membrane 80 has an array 90 of conductor vias. The ends of each via in array 90 extend slightly past the two surfaces of membrane 80 and are in precise alignment with test contacts 40. The term "via" here is used to denote a conductive column or post that extends completely through membrane 80 and is exposed on each side of membrane 80, although in this application the term "pad" is perhaps more descriptive of the actual shape than is "column." The vias that comprise array 90 and other features of membrane 80 are conventionally formed by well-known photolithographic processes.

The vias comprising via array 90 have two main purposes. First, the vias of array 90 provide mechanical support and clearance space for operation of the array 40 test contacts. The vias of array 90 also electrically connect individual test contacts in array 40 to connection pads 91-93 (see FIGS. 6 and 7) on load board 47.

Figure 5:
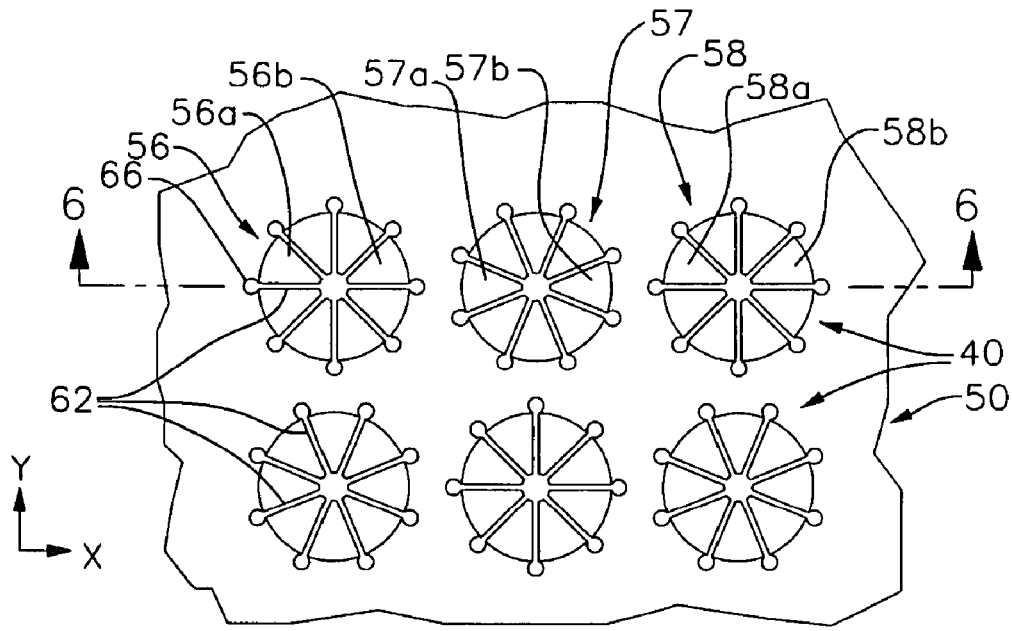
FIG. 5 is a substantially enlarged top elevation view of a portion of a test contact array.
Figure 6:
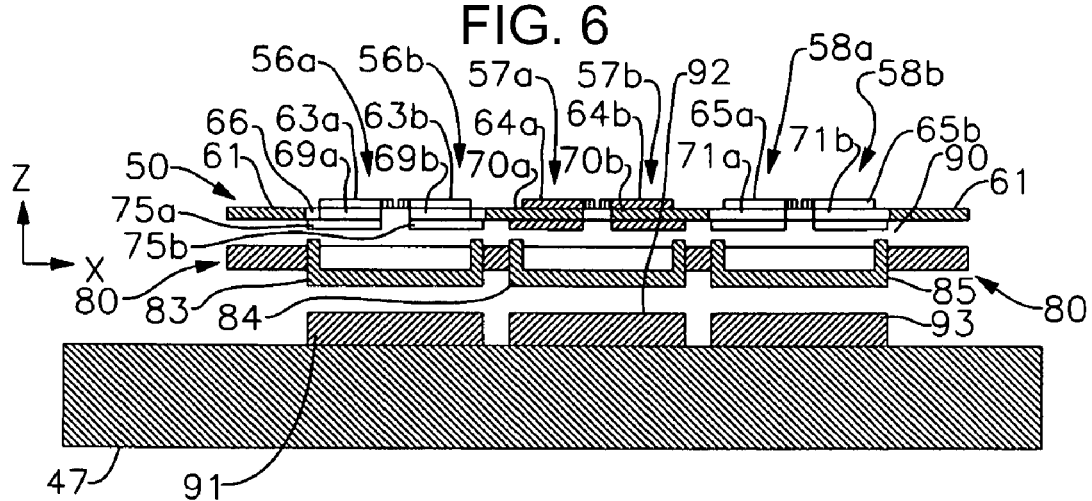
FIG. 6 is a side section view through the test contact array in exploded condition.
Figure 7:
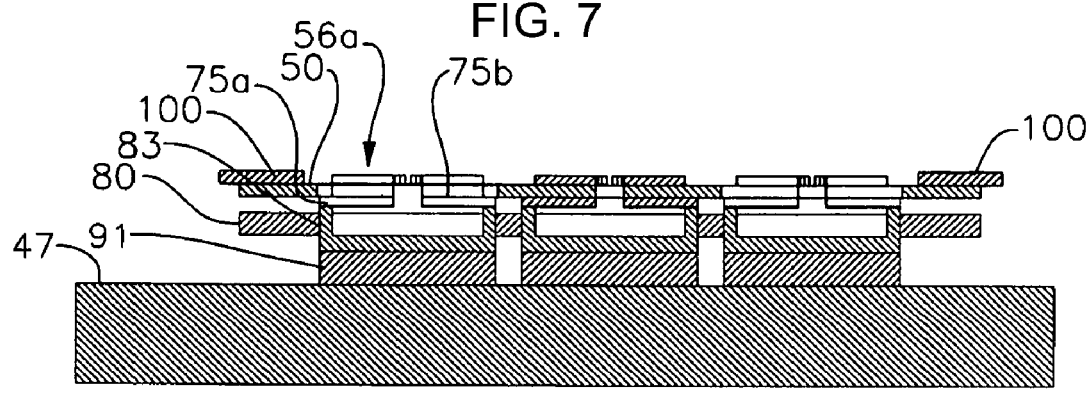
FIG. 7 is a side section view through the test contact array in assembled condition.

The structure of the test contact elements in array 40 is shown in FIG. 5-7. The FIG. 5 top projection shows three individual test contact elements 56-58 comprising a small portion of an array 40. Test contacts 56-58 display the detailed structure of all the individual test contact elements in array 40.

In one application, each of the test contacts 56-58 in array 40 comprise eight tapered fingers 56a, 56b, 57a, 57b, etc. generally configured in a pie shape. The outer ends of each of the fingers 56a, etc. are integral with layer 61 and generally form an arc of the same circle. The fingers 56a, etc. are mechanically and electrically isolated from each other by radially oriented slots 62 and other slots, undesignated. Laser machining is a convenient way to form slots 62. Portions of the initial layers of copper on layer 61 are removed to electrically isolate at least each of the test contacts 40 from each other. For Kelvin testing applications, some fingers 56a, etc. of a single test contact 56 can be electrically isolated from other fingers 56b, etc. as well.

Individual fingers 56a, etc. each subtend arcs of 45 degrees for an eight-finger embodiment. Other numbers of fingers 56a, such as two, three, four, five, six, and so forth may be alternatively used as well. In fact, rectangular rather than pie-shaped fingers may well be suitable for DUTs that do not have a BGA configuration. To avoid bridges of membrane area between adjacent test contacts 56, etc. that are too thin, individual test contacts 56, etc. are rotated 22.5 degrees with respect to each neighbor. This orientation spaces the ends of slots 62 in each of the test contacts 56, etc. as far as is possible from the slots 62 within the neighboring test contacts 56, etc.

FIGS. 6 and 7 are side elevation sections through the slots 62 etc. that define the lower edges of fingers 56a, 56b, 58a, and 58b of test contacts 56 and 58. Note that the proportions between the dimensions are not drawn to scale. The section cut for FIGS. 6 and 7 essentially bisects fingers 57a and 57b. One set of fingers 56a, etc. comprises one test contact 56, etc. Each of the fingers 56a, etc. is spaced from all of the other fingers of that test contact 40.

Each of the fingers 56a, etc. has a contact pad 63a, 63b, etc. facing in the positive Z direction. Pads 63a, 63b, etc. form for test contact 56, the surfaces that contact a terminal 20. Each finger 56a, etc. also has a connection pad 75a, 75b, etc. facing downwardly, in the negative Z direction. Contact pads 63a, 63b, etc. are in respective electrical contact with connection pads 75a, 75b, etc. This electrical connection can comprise plated edges 69a, 69b, 70a, 70b, 71a, 71b of fingers 56a, etc. as shown, or can comprise vias (not shown) that connect pads 63a, etc. to pads 75a, etc. through the inner layer 61 at a convenient point.

Each of the fingers 56a, etc. forms a cantilever beam that can elastically deflect out of the plane of membrane 50 by flexing layer 61 and, depending on the particular configuration, one or both of pads 63a, etc. and 75a, etc. comprising each of the fingers 56a, etc. To avoid stress concentration at the bases of the fingers 56a, etc., the bases of slots 62 may be wider than other points along slots 62. The bases of slots 62 that are wider may have the form of small circular openings or enlargements 66.

When in use, fingers 56a, etc. deflect downward, i.e. in the negative Z direction slightly. High stress concentration may result in permanent distortion of fingers 56a, etc. after repeated bending, which enlargements 66 at least partially alleviate. Enlargements 66 can be formed as part of the laser machining process that forms slots 62.

Interface membrane 80 is interposed between load board 47 and contact membrane 50. Membrane 80 may be somewhat thicker than membrane 50, since very little flexing of membrane 80 is required. The via array 90 in membrane 80 includes individual vias 83-85 having a cylindrical shape. Membrane 80 supports and positions the via array 90 as represented by vias 83-85, and places them in alignment with respectively, test contacts 56-58.

Load board 47 has connection pads 91-93 that connect using conventional technology to cable 42. Pads 91-93 are in precise alignment with the associated vias 83-85, thereby making solid electrical and mechanical contact with vias 83-85. This arrangement provides for extremely short conduction lengths between the BGA contacts 20 of a DUT 10 and the load board 47 connection pads 91-93.

Vias 83-85 have the shape of a cup with open end up, as shown in FIGS. 6 and 7. The edge of each via 83-85 contacts the adjacent connection pads 75a, etc. on fingers 69a, etc., and similar connection pads on the fingers of test contacts 57, 58, etc.

A number of reasons exist for this configuration of vias 83-85. In the first place, the structure allows each of the fingers 56a, etc. to flex freely downwards. Secondly, the cup-shaped structure of vias 83-85 is well-suited to collecting most of the inevitable debris that the testing process creates. As fingers 56a, etc. contact individual balls 20, debris that forms, falls through the fingers and is held within the vias 83-85. Protecting load board 47 from this debris prevents electrical performance from degrading and the load board 47 from mechanical damage.

FIG. 7 shows a portion of well when assembled. Connection pads 75a, 75b, etc. are in firm electrical and mechanical connection with via 83. Note that the alignment plate 45 does not restrict flexing of individual fingers 56a, etc. The firm mechanical connection between connection pads 75a, etc. and via 83 minimizes the amount of debris that penetrates the contact area between connection pads 75a, etc. and via 83.

Figure 8:
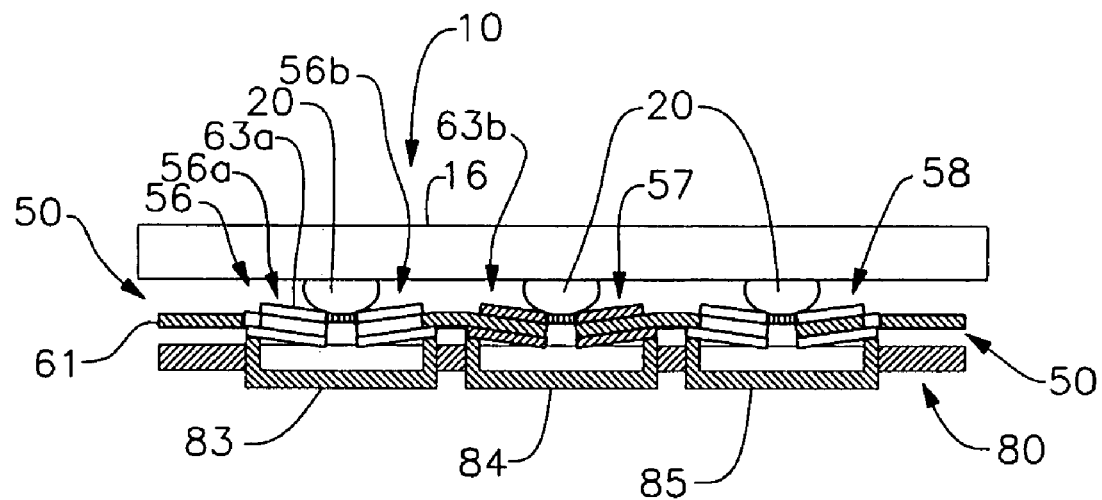
FIG. 8 is a side section view through the test contact array with ball terminals in test position on the test contacts.

FIG. 8 shows the BGA terminals 20 of a DUT 10 in mechanical and electrical contact with the test contacts 56-58 as contacts 20 might be during an actual test procedure. Fingers 56a, etc. deflect elastically and independently into the interior spaces of vias 83-85 under force applied by a DUT loading element of the test equipment. If an individual BGA terminal 20 is in less than perfect alignment with its test contact 56-58, the independent compliance of each individual finger 56a, etc. assures that good electrical contact occurs between the test contact 56, etc. involved and the associated BGA terminal 20 throughout the test procedure.

A spacer 100 positions a DUT 10 properly in the Z axis position during loading, and prevents DUT 10 from pressing excessively on test contacts 65, etc.

The central area of each BGA terminal 20 does not touch any of the fingers 56a, etc. Accordingly, these central areas remain unmarked during the testing procedure.

The spaces formed by the slots 62 and the gap between the free ends of fingers 56a, etc. allow debris to fall through to the interior of vias 83-85. The cup configuration of each via 83-85 traps the debris and prevents the debris from reaching load board 47 and mechanically damaging load board 47, which is an expensive component of the test equipment.

Figure 9:
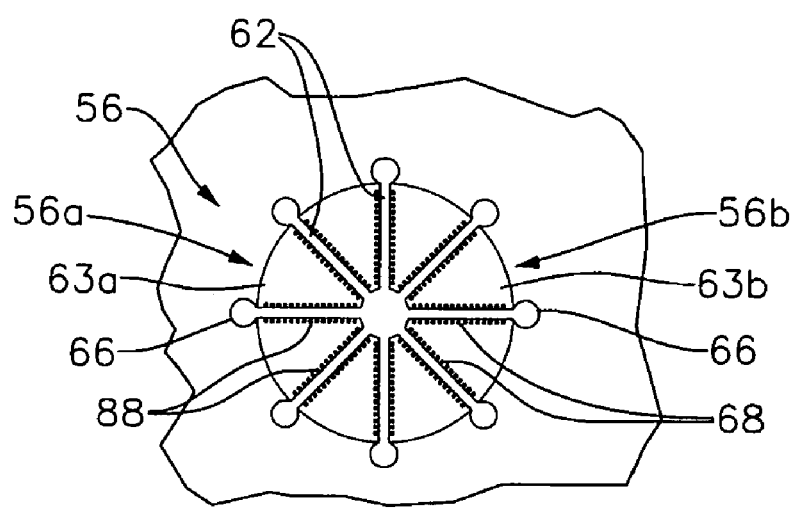
FIG. 9 is a further enlarged top elevation view of a single test contact, and showing additional features of a preferred embodiment.

FIG. 9 is a further enlarged top elevation view of test contact 56, which shows further features thereof In particular, serrations or teeth 88 on the surfaces 63a, etc. of individual fingers 56a, etc., make contact with BGA terminals 20 during testing. Teeth 88 cut and scratch through any oxide layer on BGA terminals 20 while terminals 20 are pressed onto test contacts 56 etc. Teeth 88 may be positioned at any convenient place on the contact pads 63a, etc. Ideally, teeth 88 are in approximate radial alignment with the circle defining each of the test contacts 56, etc. This allows a cutting effect of teeth 88 on BGA terminal 20 surfaces while microcircuit 10 is loaded into receptacle 30 and BGA terminals 20 deflect fingers 56, etc.

The teeth 88 can be formed by a variety of techniques. A preferred technique is to form teeth 88 along the edges of fingers 56a as a serendipitous byproduct of the preferred laser machining process for forming slots 62. The use of relatively high laser beam intensity during the slot-forming process causes splashing and furrowing of the copper sheet carried by membrane 50. Ideally, the laser machining beam is directed onto the top surface of membrane 50. Often, the exposed copper surfaces of fingers 56a, etc. are plated with thin layers of nickel and gold. This plating process does not seem to interfere with the ability of teeth 88 to adequately cut into the surfaces of BGA terminals 20.

The following exemplary values are suitable for various dimensions of the components in a receptacle 30 designed for BGA terminals 20 having 0.8 mm centers. Approximate values for dimensions not specifically stated can be inferred from those given. The diameter of the test contact 56 is 0.5 mm. The width of the slot 62 is 0.03 mm. The thickness of layer 61 is 0.025 mm. The thickness of pads 63a and 75a is 0.018 mm.

The Z axis compliance of fingers 56a, etc. is a function of finger 56a, etc. length and thickness and I/O exposure allowing for multiple fields of contacting use.

Figure 10:
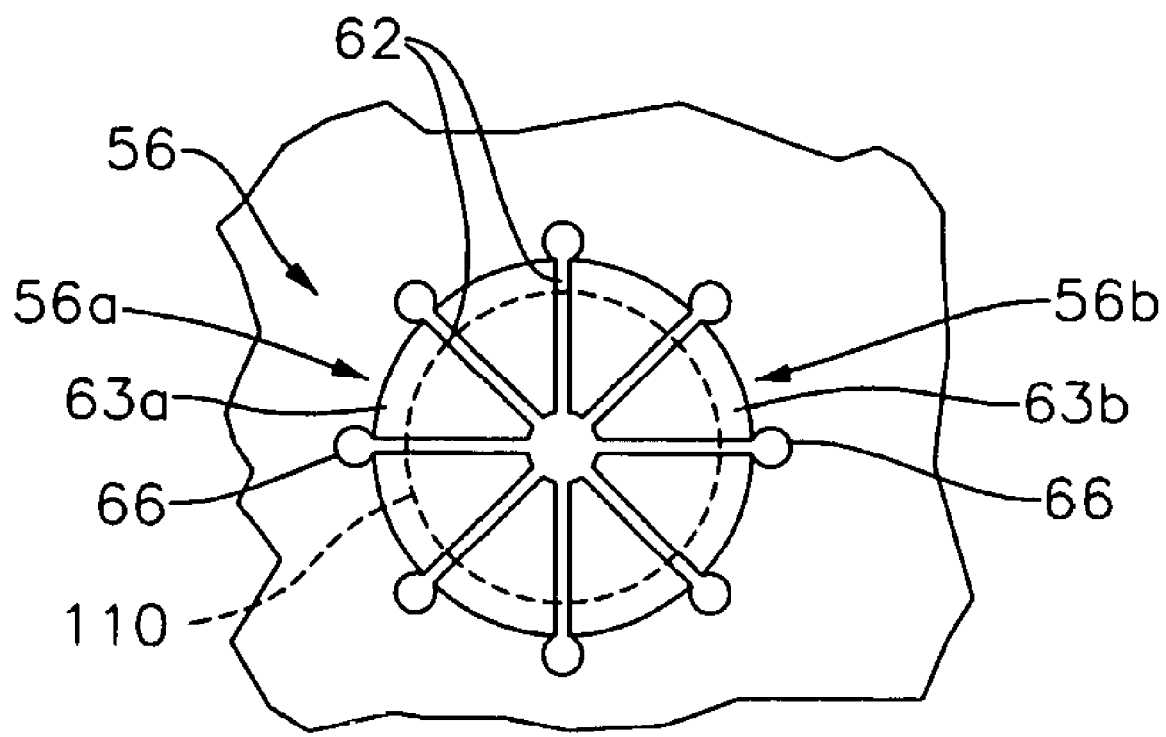
FIG. 10 is a perspective view of a test contact array.

FIG. 10 is a perspective view of a portion of a contact membrane 50. One can see the individual contact pads 63a, etc. projecting slightly above the surrounding surface of membrane 50.

Figure 11:
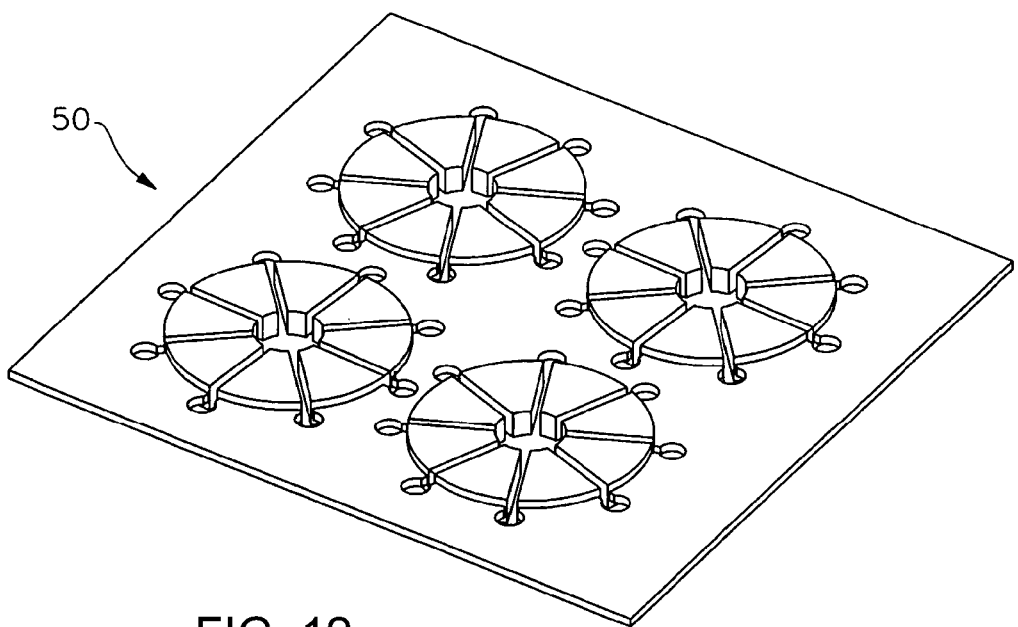
FIG. 11 is a top elevation view of a complete, commercially usable interface membrane including alignment features.

FIG. 11 is a top elevation view without enlargement, of an interface membrane 80 with a complete via array 90 and alignment features 92 for precisely positioning membrane 80 relative to alignment plate 45.

Figure 12:
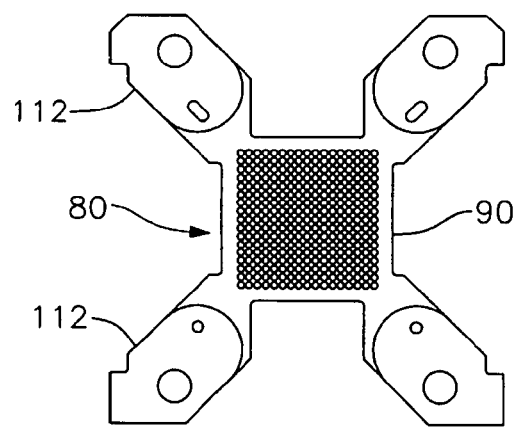
FIG. 12 is a top elevation view of a complete, commercially usable contact membrane including alignment features.

FIG. 12 is a top elevation view without enlargement, of a contact membrane 50 with a complete test contacts array 40 and alignment features 95 for precisely positioning membrane 50 relative to alignment plate 45. Note the series of holes in each of the four corners of the top contact plate. In each series, there is a large, circular hole, which is a mounting hole. This membrane is mounted to the load board through these holes. Two of the corners have two small, circular holes, while the other two corners have small, elongated holes. These are alignment holes, through which alignment pins pass from the alignment plate, through this membrane and through the remaining pieces of the contactor assembly. The alignment pins hold everything precisely in place.

The vias 83-85 rigidly contact load board 47, which reduces load board 47 wear, a problem with other test contact designs. The design has a signal path that is relatively short and has only one or two rigid parts, so contact resistance is lower and more consistent than for designs with more parts in the path. This feature also improves electrical performance during the test procedure. The presence of a hollow conductor for a via confines the electric field ("E-fields"). The design reduces the number of right angle connections, improving electrical performance and signal fidelity.

Figure 13:
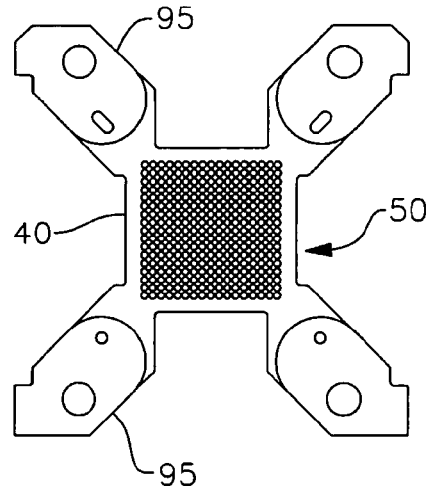
FIG. 13 is a top elevation view of a complete, commercially usable spacer membrane including alignment features.

FIG. 13 shows the shape of the interface membrane plate with conductive cups to trap debris and allow fingers from the top contact plate to bend into the via holes.

Figure 14:
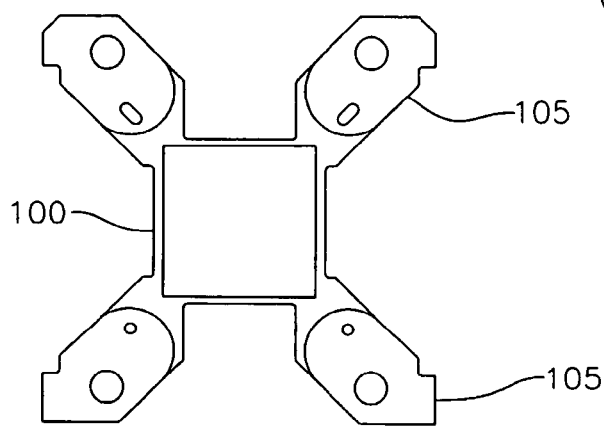
FIG. 14 is a perspective view of an alternative embodiment of the invention, using a spacer membrane to control device presentation height.

FIG. 14 shows a spacer to control the depth at which the device is inserted into the contactor, thus controlling the amount of membrane finger flexing. Alignment features 105 position spacer 100 properly in the Z direction with respect to test contact array 40.

Figure 15:
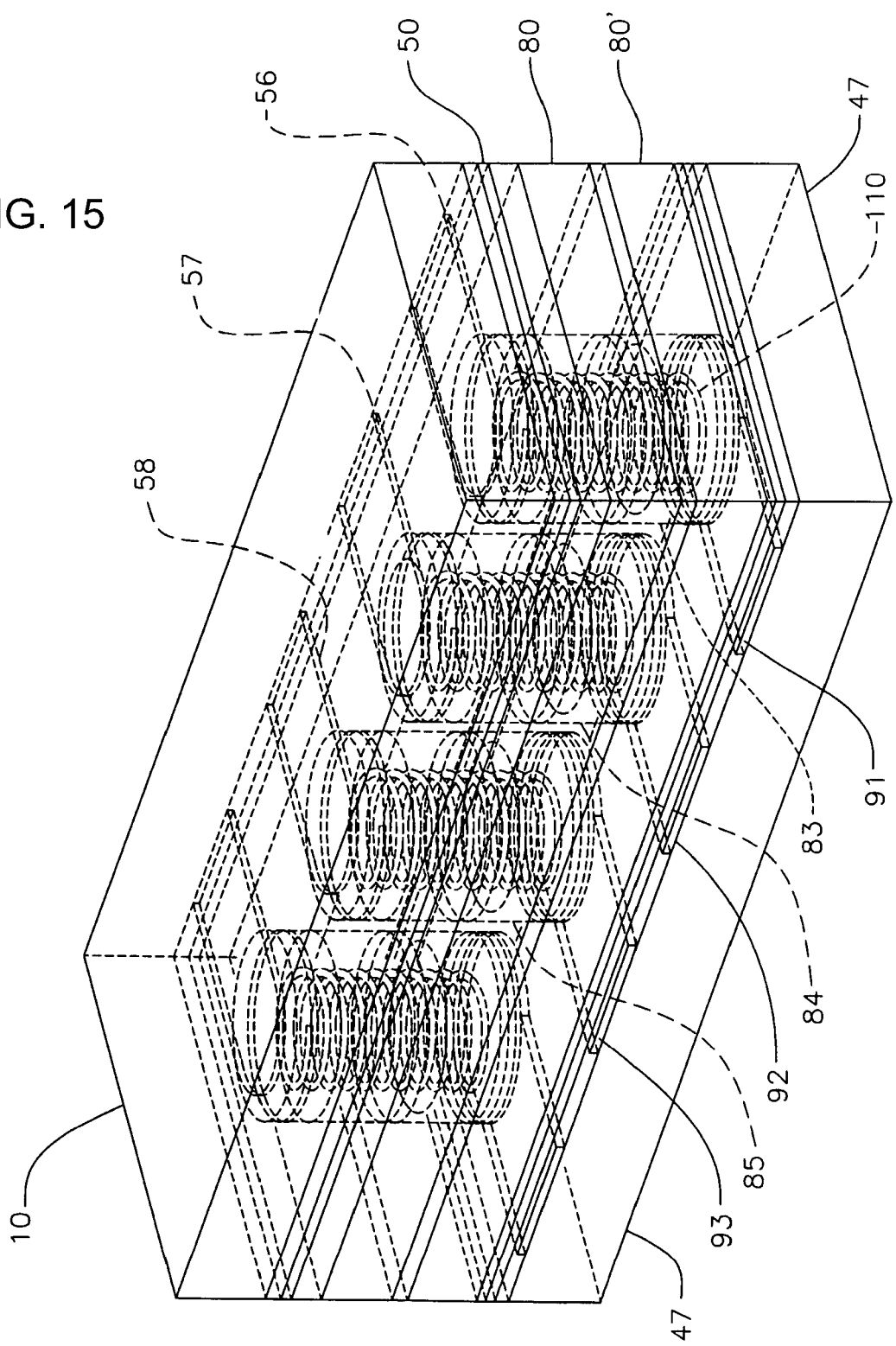
FIG. 15 is a top elevation view of a test contact showing the position of a spring biasing the test contact fingers.

FIG. 15 shows vias 83-85 configured with internal springs 110 that apply force at an intermediate point on fingers 56, etc. FIG. 15 shows springs 110 interposed between the bottoms of the interior of vias 83-85 and individual fingers 56-58. The embodiment may in addition to interface membrane 80, require a second interface membrane 80'. The use of a spring 110 has the advantages of additional Z axis compliance, a further conduction path between fingers 56-58 and vias 83-85, and improved overall electrical performance.

The structure can be modified to allow Kelvin testing on a BGA or Land Grid Array (LGA) device packages. The Kelvin traces, if placed on circuit, could be routed to an interface where they are tied to a Kelvin measuring system without the need to modify boards using a connector to adapt to the Kelvin test system. The test contact 56 structure can be modified to electrically isolate half of the fingers 56a, etc. from the remaining fingers 56a, etc. Individual vias 83-85 can be divided to provide separate connections to the two sets of fingers 56a, etc. comprising each test contact 56, etc.

A slightly modified pad type can be used as a fiducial for optical handers that allow very accurate placement of the parts in the test contactor. The tolerances on the extra fiducial pad with a precision cut pattern would allow for optimum centering of the device on the contactor. The pad could be a distance from the device so the housing would need a small hole to allow the optics to align on the pad. Such a modification potentially may eliminate the need for alignment plate 45.

Alternatively, the design may include electrical isolation between each finger 56, etc. allowing higher thermal capability and reduced inductance of the path by doubling the number of paths from the top side to load board side. Electrically isolating each individual finger 56a, etc. from the other fingers of the test contact 56 may improve electrical performance.

The pads 63a, etc. can have many different sizes and shapes to match the device and/or device package I/O size, shape and pitch. Different thicknesses and strengths of layer 61; pads 63a, etc.; and 75a, etc. will provide different contact forces to the device I/Os. This feature allows contact force control to best penetrate different types and thicknesses of oxides, both of which range widely. Loaders are limited in the force they can provide. The ability to adjust the contact force allows for matching contact force to loader force.

A flexible insulating material is used to adjust the device resting point and optimize insertion forces. The spacer 100 thickness will be solely a function of the ball extension on the device or device package. By making the spacer out of the same material as the contact plate, real time compression adjustment occurs to account for contact pin stress relieving during operations at elevated insertion levels.

This design uses only two parts to interface both mechanically and electrically between a device and/or device package I/O and a load board during non-destructive device testing. A particular contact membrane 50 is potentially usable for a certain test application or can be a standard footprint for a family of devices with the same pitch. The interface membrane 80 may be a rigid circuit thick and stiff enough to assure the DUT I/O does not make destructive contact with load board 47. In this embodiment, an alignment plate fits on top and aligns the DUT to test contact array 40. Accordingly, multiple devices can be tested at the same time using minimum load board space. The rigid interface membrane 80 has conductor paths that route the signals directly to predetermined test points on the load board. In effect, the interface membrane 80 is specific to the DUT while the test contact array 40 is standardized.

This application may have cost advantages since the test contact array 40 is more costly to manufacture than the interface membrane 80. This concept can be used to make contact to die on wafer and singulated die. The flexible interface on top can have embedded components that allow the test contactor system to simulate soldering a part to the printed circuit or load board. The flexible or membrane circuit on top is designed to have the following features:

1. Ability to make contact with device I/Os in an area that won't damage the I/O for future soldering.
2. Wipe function wipes through oxide layers on the I/O.
3. Slots in flexible circuit allow for user defined Z-compliance.
4. Slots is flexible circuit allow for multiple contact points to device to lower contact resistance and inductance.
5. Flexible circuit have matching or decoupling components embedded in the circuit and close to device inputs and outputs.
6. Pad pattern would be a function of device pitch, I/O size, and I/O extension so concept would be easily scalable with integrated circuit package ranges down to the pitch ranges on die.
7. The concept will work over military temperature range.
8. Ability to test multiple parts at the same time in small printed circuit board space will be optimum for production testing and burn-in testing.
9. Contact Plate could be shaped to the I/O geometry on device.
10. Solderless surface mount connection.
11. Semi-rigid contacts.
12. Ability to contact ball, pad or leaded terminals.
13. Multiple independent contacting of DUT terminals.
14. Self-centering feature and ability to optically align for increased precision.

The rigid board (or interface membrane) below would have the following features:

1. Route signals directly to load board with minimum distance.
2. Interface with device under test inside cylinder to reduce EMI and crosstalk.
3. Custom signal routing is done to allow load boards to be reusable.
4. Provide a barrier between contact plate and expensive load board in case of part jamming or forces applied to contactor extremely high. If something is going to break, customer is going to want it to be the cheapest part of system.
5. Solderless surface mount.
6. Semi-rigid contacts.

This concept can be used in automated test environments without the need to screw in contactor or alignment plate to load board prior to testing. This makes the contactor easy to assemble and replace or clean. This would also allow for more precise alignment for smaller pitch devices.

Very low profile is employed so electrical performance is superior to any other BGA contactor or socket on the market. The contactor will have no wear on the load board and wipe the device in an area that will not affect its solder yet provide superior contact resistance. The concept will have multiple wipe points and redundancy in contacting the ball to reduce contact resistance and to reduce amount of opens even when some debris is present. The BGA interface could be used to facilitate self-alignment of the balls. Dimensions of the concept could easily be scaled to test very small devices with very small balls and even test bumped wafers, to be implemented as a concept, could be inverted to hit bumps on the wafer from the top. Designs can be developed so the contact plate can be rotated 180 degrees or reversed and still function properly. If devices are misaligned slightly, this feature could reduce the need for cleaning and increase potential life significantly.

The concept will determine when balls on the device are not present. The concept would work very well in applications that require large compliances such as strip testing. Debris generated from inserting the device into a test socket or contactor would fall through the hole in the interface membrane 80 to load board 47 and not affect testing. Intervals between maintenance required by debris buildup can thereby be lengthened. The flexible interface would be easy to replace and cost effective to throw away once its useful life expired. This concept takes only minutes to replace the top membrane 50, versus hours to rebuild a similar spring pin socket. The concept provides for the ability to use a flexible circuit to help in routing test signals to connectors on the edge of a board.

This Kelvin BGA concept is the first time anything has been developed to Kelvin test a BGA package. This may be extremely valuable, as doing Kelvin on a BGA package would allow for external connection to a test system without making expensive modifications to the load board. Basically, a person using the invention would only use the Kelvin concept when he wanted to monitor the contact resistance results to allow a more accurate measurement and to extend the time between cleaning or maintenance cycles.

It is instructive to summary the general operation thus far.

Consider an electrical chip that is manufactured to be incorporated into a larger system. When in use, the chip electrically connects the device to the larger system by a series of pins or terminals. For instance, the pins on the electrical chip may plug into corresponding sockets in a computer, so that the computer circuitry may electrically connect with the chip circuitry in a predetermined manner. An example of such a chip may be a memory card or processor for a computer, each of which may be insertable into a particular slot or socket that makes one or more electrical connections with the chip.

It is highly desirable to test these chips before they are shipped, or before they are installed into other systems. Such component-level testing may help diagnose problems in the manufacturing process, and may help improve system-level yields for systems that incorporate the chips. Therefore, sophisticated test systems have been developed to ensure that the circuitry in the chip performs as designed. The chip is attached to the tester, as a "device under test", is tested, and is then detached from the tester. In general, it is desirable to perform the attachment, testing, and detachment as rapidly as possible, so that the throughput of the tester may be as high as possible.

The test systems access the chip circuitry through the same pins or terminals that will later be used to connect the chip in its final application. As a result, there are some general requirements for the test system that perform the testing. In general, the tester should establish electrical contact with the various pins or terminals so that the pins are not damaged, and so that a reliable electrical connection is made with each pin.

Most testers of this type use mechanical contacts between the chip pins and the tester contacts, rather than soldering and de-soldering or some other attachment method. When the chip is attached to the tester, each pin on the chip is brought into mechanical and electrical contact with a corresponding pad on the tester. After testing, the chip is removed from the tester, and the mechanical and electrical contacts are broken.

In general, it is highly desirable that the chip and the tester both undergo as little damage as possible during the attachment, testing, and detachment procedures. Pad layouts on the tester may be designed to reduce or minimize wear or damage to the chip pins. For instance, it is not desirable to scrape the device I/O (leads, pins, pads or balls), bend or deflect the I/O, or perform any operation that might permanently change or damage the I/O in any way. Typically, the testers are designed to leave the chips in a final state that resembles the initial state as closely as possible. In addition, it is also desirable to avoid or reduce any permanent damage to the tester or tester pads, so that tester parts may last longer before replacement.

There is currently a great deal of effort spent by tester manufacturers on the pad layouts. For instance, the pads may include a spring-load mechanism that receives the chip pins with a prescribed resisting force. In some applications, the pads may have an optional hard stop at the extreme end of the spring-load force range of travel. The goal of the pad layout is to establish a reliable electrical connection with the corresponding chip pins, which may be as close as possible to a "closed" circuit when the chip is attached, and may be as close as possible to an "open" circuit when the chip is detached.

Because it is desirable to test these chips as quickly as possible, or simulate their actual use in a larger system, it may be necessary to drive and/or receive electrical signals from the pins at very high frequencies. The test frequencies of current-day testers may be up to 40 GHz or more, and the test frequencies are likely to increase with future generation testers.

For low-frequency testing, such as that done close to DC (0 Hz), the electrical performance may be handled rather simplistically: one would want an infinitely high resistance when the chip is detached, and an infinitesimally small resistance when the chip is attached.

At higher frequencies, other electrical properties come into play, beyond just resistance. Impedance (or, basically, resistance as a function of frequency) becomes a more proper measure of electrical performance at these higher frequencies. Impedance may include phase effects as well as amplitude effects, and can also incorporate and mathematically describe the effects of resistance, capacitance and inductance in the electrical path. In general, it is desirable that the contact resistance in the electrical path formed between the chip pin and the corresponding pad on the load card be sufficiently low, which maintains a target impedance of 50 ohms, so that the tester itself does not significantly distort the electrical performance of the chip under test.

For modern-day chips that have many, many closely spaced pins, it becomes helpful to simulate the electrical and mechanical performance at the pin/pad interface. Finite-element modeling in two- or three dimensions has become a tool of choice for many designers. In some applications, once a basic geometry style has been chosen for the tester pad configuration, the electrical performance of the pad configuration is simulated, and then the specific sizes and shapes may be iteratively tweaked until a desired electrical performance is achieved. For these applications, the mechanical performance may be determined almost as an afterthought, once the simulated electrical performance has reached a particular threshold.

We now turn our attention to a more specific tester configuration, which is discussed above in great detail and is summarized here.

The test fixture includes two replaceable membranes between the device under test (DUT) 10 and the load board 47. Each of these membranes is relatively inexpensive and easy to replace, compared with a new load board 47, so these membranes are designed to accept damage and debris so that the load board 47 remains undamaged. It should be noted that there may also exist a multitude of mechanical elements for placing and supporting the device under test; these are not discussed here.

The membranes may be referred to as a contact membrane 50, which faces the device under test 10, and an interface membrane 80, which is between the contact membrane 50 and the load board 47. During the test procedure, the device under test 10 contacts the contact membrane 50, the contact membrane 50 in turn contacts the interface membrane 80, and the interface membrane 80 in turn contacts the load board 47. Each of these membranes 50, 80 includes specific structures, which are detailed below.

The contact membrane 50 includes a series of paired electrical pads, each pair being on opposite sides of the contact membrane 50, each pair corresponding to a particular pin or terminal 20 on the device under test 10, and the two pads in each pair being permanently electrically connected to each other through the contact membrane 50.

The pads facing the device under test 10 are referred to as contact pads 56-58, and the pads facing away from the device under test are referred to as connection pads 75. During use, each terminal 20 on the device under test 10 contacts a corresponding contact pad 56-58, making a mechanical and electrical connection between the terminal 20 and the contact pad 56-58. Because the contact pads 56-58 and connection pads 75 are permanently electrically connected, pairwise, there is therefore an electrical connection between each terminal 20 and its corresponding connection pad 75.

The interface membrane 80 includes a series of vias 83-85, which are essentially cup-shaped holes made out of a conducting material. The base of each cup contacts a button contact membrane which in turn contacts a corresponding connection pad 91-93 on the load board 47. The rim of each cup is spaced apart from the contact membrane 50 when the device under test 10 is detached, and contacts a corresponding connection pad 75 on the contact membrane 50 when the device under test 10 is attached.

Each via 83-85 on the interface membrane 80 generally has a one-to-one correspondence with a terminal 20 on the device under test 10, and a one-to-one correspondence with a connection pad 91-93 on the load board 47. Note that on the contact membrane 50, there may be a single pad pair for each terminal 20 on the device under test 10, or there may be multiple pad pairs for each terminal 20. Furthermore, the contact pads 56-58 and connection pads 75 may have a one-to-one correspondence, or there may be several contact pads 56-58 for each connection pad 75, or there may be several connection pads 75 for each contact pad 56-58, or there may be a combination of all of these. Although much the language used below assumes a one-to-one correspondence among these pads, it will be understood that there may be several pads on one side of the contact membrane 50 corresponding to each pad on the opposite side of the contact membrane 50, and/or several pads on the contact membrane 50 corresponding to each terminal 20 on the device under test 10. Note that in some applications, it may be desirable to have segregated pads on the contact membrane, which may perform different monitoring tasks—these segregated pads may each have an independent electrical path from one terminal to one of various contacts on the load board.

We summarize the electrical path during testing: When the device under test 10 is attached to the test fixture, each terminal 20 on the device under test 10 contacts a contact pad 56-58 on the contact membrane 50. Each contact pad 56-58 is permanently electrically connected to a connection pad 75 on the opposite side of the contact membrane 50. Each connection pad 75 on the contact membrane contacts a rim of a via 83-85 on the interface membrane 80 when the device under test 10 is attached to the test fixture. Each via 83-85 on the interface membrane 80 contacts a connection pad 91-93 on the load board 47. In this manner, a circuit is completed between the terminal 20 on the device under test 10 and the connection pad 91-93 of the load board 47. Presumably, the contact resistance along this circuit is sufficiently low, or at least is manageable, in the range of the test frequencies, and the characteristic impedance of the system matches that of the device under test and the test equipment used to measure signals on the device under test. Most systems use a characteristic impedance of 50 ohms.

There are variations possible to the scheme described in the previous paragraphs. In particular, there are variations to the mechanism used to provide a resisting force to the terminal 20 on the device under test 10. This resisting force provides a general compliance to the test fixture, so that when the device under test 10 is brought into contact with the test fixture, each terminal 20 experiences a small, non-damaging resistance from the contact pad 56-58, generally perpendicular to the plane of the device under test 10. This resisting force ensures a good electrical contact between the terminal 20 and the contact pad 56-58.

In general, it is desirable that test fixture has a relatively large Z-displacement between when the terminal 20 first contacts the contact pad 56-58 and when the terminal finally comes to rest (i.e., when the device under test 10 is fully engaged in the test fixture). This large Z-displacement may help the test fixture accommodate parts that have relatively loose terminal tolerances. If some terminals on a particular part are longer or shorter than others, the relatively large Z-displacement may help ensure that good electrical contact is made with each terminal, without significant damage to the terminals or to the test fixture.

In the following paragraph, we summarize one resisting force mechanism, which is described earlier in this document in more detail. Following this summary, we then describe in detail various alternatives to the summarized resisting force mechanism.

In very basic terms, a terminal 20 on the device under test 10 contacts a portion of the contact membrane 50. The portion of the contact membrane 50, being supported at one end and being free at the other end, deflects in a cantilever-like fashion. Near the fixed end of the cantilever, the deflected contact membrane 50 contacts a rim of the via 83-85 on the interface membrane 80. The base of the via 83-85 in turn contacts the load board 47. In some applications, the interface between the base of the via 83-85 and the load board 47 is rigid, or non-compliant, because there is sufficient compliance from the cantilever structure. In some applications, the cantilever-like structures on the contact membrane are wedge-shaped, are arranged in a pie shape, are supported at their circumference, and are free in the center of the pie.

There are alternatives to the pie-shaped cantilever structure for providing a resisting force to the terminals 20 on the device under test 10. Four of these possible alternatives are described sequentially in detail below; it is understood that other alternatives are possible as well.

A first alternative to the pie-shaped cantilever may be referred to informally as a "single coil spring inside the via".

Figure 16:
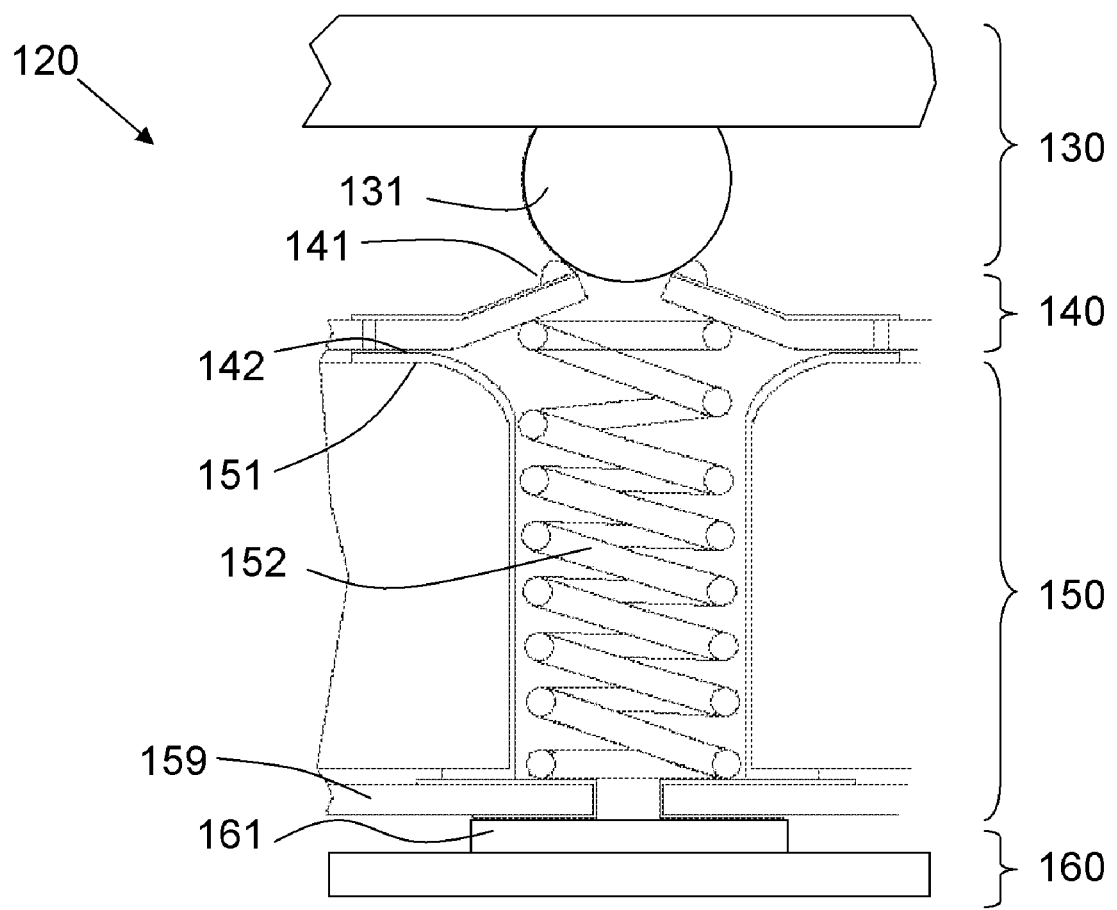
FIG. 16 is a side view of a test fixture having a single coil spring inside each via, with the device under test not yet engaged with the test fixture.
Figure 17:
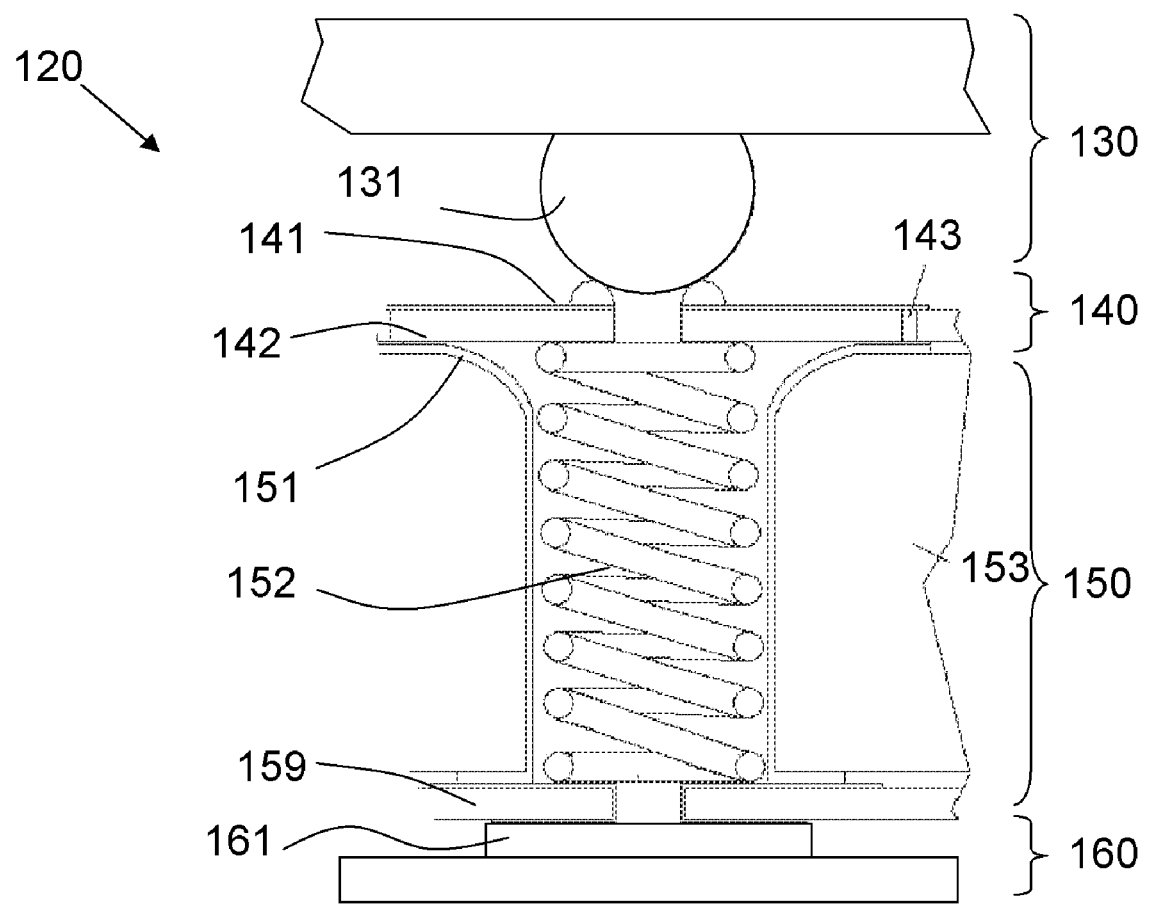
FIG. 17 is a side view of the test fixture of FIG. 16, with the device under test engaged with the test fixture.

FIGS. 16 and 17 show a portion of an exemplary test fixture 120 having a single coil spring inside each via. In FIG. 16, the device under test 130 is not yet engaged with the test fixture, and is barely contacting the contact pads 141. In FIG. 17, the device under test 130 is fully engaged with the test fixture.

The device under test 130 includes many terminals 131, each of which may be tested independently and simultaneously by the test fixture 120. In many cases, the shape of the terminal 131 may be roughly spherical, and the terminal 131 may be referred to as a ball.

Each terminal 131 contacts one or more contact pads 141 on the top side of a contact membrane 140. The contact pad 141 may be similar in construction to the contact pads 56-58 described above. In some cases, the shape of the contact pad 141 may be roughly circular, corresponding to the shape of the corresponding terminal 131. In some cases, there is only one contact pad 141 per terminal 131. In other cases, there may be several contact pads 141 for each terminal 131, with the contact pads 141 being segmented. The segmentation may be pie or wedge-shaped, circular, linear in stripes, rectangular, irregular or any other suitable shape. In some cases, the feature length is parallel to the ball movement during insertion into 120.

The contact pad 141 may optionally include one or more features that protrude out of the plane of the contact membrane 140, such as bumps, edges, hills, and so forth. The optional protruding features may help establish a good electrical connection with the corresponding terminal, and in some cases may allow the test fixture to work with devices under test 130 that have relaxed tolerances on their respective terminals. In some cases, the optional protruding features have edges corresponding to segmentation edges on the contact pad. In some cases, the optional protruding features may have shapes such as hemispheres, partial spheres, bumps, rectangles, a checkerboard pattern, concentric circles, stripes, or any other suitable shape.

The contact pad 141 on the top surface of the contact membrane 140 is permanently electrically connected to one or more connection pads 142 on the bottom surface of the contact membrane 140. Such a permanent electrical connection 143 may be may through the contact membrane. The connection pads 142 may also be optionally segmented, but the segmentation may or may not be the same as that of the contact pads 141. In general, each contact pad 141 is associated with a particular terminal, and each connection pad 142 is associated with a terminal; the precise association between a particular contact pad 141 and a particular connection pad 142 is less important than the associations between the pads 141 and 142 and their respective terminals.

In some cases, the top and bottom surfaces of the top contact plate, or contact membrane 140, are made from the same material and are the same thickness. This may put the metal contact area on or close to a neutral contact area, which may reduce stresses and result in a longer part life.

When the device under test 130 is attached to the test fixture, the terminals 131 contact their respective contact pads 141 on the contact membrane 140 and force the contact membrane 140 into contact with an interface membrane 150.

Adjacent to and parallel to the contact membrane 140 is an interface membrane 150, which includes a via 151. The via 151 may be cup-shaped, as described above for the vias 83-85, with a rim facing the contact membrane 140 and a base facing away from the contact membrane 140.

In some cases, the rim of the via 151 extends beyond the plane of the interface membrane 150, toward the contact membrane 140. In other cases, the rim of the via 151 is flush with the top surface of the interface membrane 150. In some applications, the via 151 has an electrically conducting wall. The rim of the via 151 may be generally circular in cross-section shape, although any suitable shape may be used. In general, it is preferable to avoid sharp angles through any current-conducting portions of the test fixtures, in order to reduce any undesirable impedance and/or inductance effects.

The base of the via 151 may be generally circular in cross-section, although any suitable shape may be used. The base may be continuous, or may optionally be segmented. As with the pads mentioned above, the segmentation may take on any suitable shape, and each segment is ultimately associated with a particular terminal 131 on the device under test 130. In some cases, the base of the via 151 may include one or more holes. For sufficiently large holes, the via 151 may be able to vent debris that may have otherwise accumulated inside the via 151.

The via 151 itself houses a spring 152, which may include one or more coils inside the via. In some cases, the spring 152 is anchored at its base to the interface membrane 150, with its free end facing the contact membrane 140. The spring 152 provides a resisting force, through the contact membrane 140, to the respective terminal 131 on the device under test 130. In general, the spring 152 in each slot provides a bias downward to make sure the lower contact plate, or interface membrane 150, has a good connection to load board 160.

The spring 152 itself may be an elastically formable coil which, in its relaxed position, extends beyond the plane of the interface membrane 150 toward the contact membrane 140. The base of the coil may be attached to the wall of the via 151 or the base of the via 151. The base of the coil may include one or more loops that lie parallel to the base of the via 151, rather than at a slight incline like most of the loops in the coil. Such coil or coils at the base may optionally be slightly enlarged, and/or may extend into the wall of the via 151 in order to become anchored to the via 151. Similarly, the top of the coil may also include one or more loops that lie parallel to the contact membrane 140, to ensure good contact between adjacent elements without generating any undesirable torques.

The spring 152 may be made from a metal, and may conduct electricity. As a result, the spring may optionally carry current to and/or from the terminal 131 of the device under test 130 from and/or to the corresponding connection pad 161 of the load board 160. Current may also be carried through the via 151 wall. In general, the wall of the via 151 may be able to conduct more current than the spring, so it is preferable to use the via wall, with or without the spring, for conduction, rather than force all the current through the spring.

The bottommost surface of the interface membrane 150 is a bottom contact plate 159. For the purposes of this application, the bottom contact plate 159 is considered to be part of the interface membrane, although in practice, it may be a separate element. In some cases, the bottom contact plate 159 may be constructed similarly to the contact membrane 140.

The load board 160 includes various connection pads 161, with each connection pad 161 corresponding to a terminal 131 on the device under test 130. Typically, there is a one-to-one correspondence between the terminals 131 and the connection pads on the load board 160, although other arrangements are possible. The construction of the load board 160 and connection pads 161 are similar to the load board 47 and connection pads 91-93 described above.

In some cases, the interface membrane 150 may include one or more relatively soft, conductive pads on the side facing the load board 160, so that when the interface membrane 150 and the load board 160 are brought together, the soft pads may deform slightly and help prevent damage to the load board 160. Such soft, conductive pads may be made from gold, or from any other relatively soft, conductive metal. In the absence of these soft, conductive pads, the base of the via 151 may contact an optional conductive pad on the bottom surface of the interface membrane 150 or may directly contact the connection pad 161 on the load board 160.

With regard to the structure of the interface membrane 150, the structural material 153 that makes up most of the membrane volume may be referred to as an interface plate translator (IPT). The curved radius at the top portion of the IPT may be used to bend the top contact around and relieve the stresses. The top contact plate may be adhered to the IPT through a thin film of solder on both sides. Other methods of adhering the top contact plate to IPT may include using welding, non-conductive epoxy between pie pieces, or conductive epoxy on pie piece pads. The spring in slot or via may provide an upward bias to the top contact plate. This upward bias may allow the fingers to hit balls higher on the sides to keep away from scrubbing on the no contact zone on the bottom of the ball so device under test can be reliably soldered to substrate after testing. The bottom contact plate can be the same as the top contact plate for economic reasons or it can be different. The bottom footprint may optionally match the load board footprint for other on-center technologies to allow for this concept to be a direct replacement for previous concepts that may have inferior performance. The IPT can also have a slight chamfer on bottom to hold the spring in place if the spring is designed with a slightly larger radius on its bottom turn. The top bumps, which may help provide more compliance and provide scrubbing action on side of balls, may be formed using a wire bonder set up to provide formed bump or a standard stud bumping machine. To add height to the flexible contact plate, multiple bump studs may be placed on top of each other to increase the bump height up to 4 mils or more. Depending on equipment forming the stud bumps, the bumps may be formed to either improve scrubbing action on devices that need more wipe due to oxide buildup or to add more height to add more Z-compliance, or a combination of the two.

Figure 18:
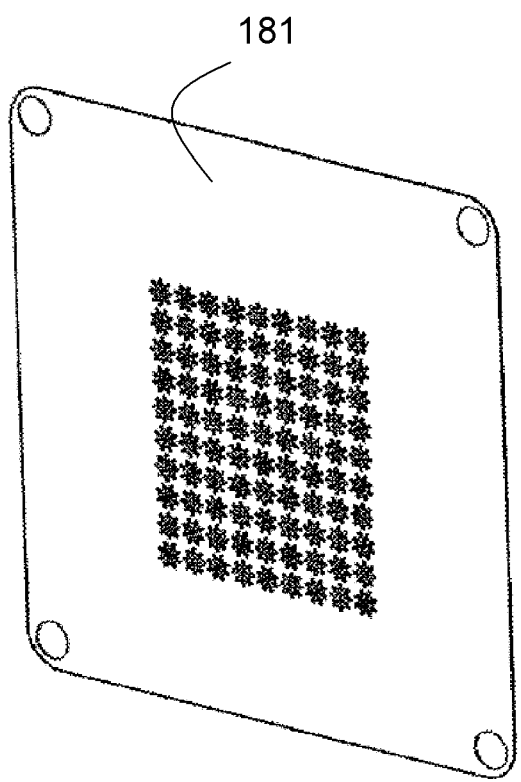
FIG. 18 is a plan drawing of a of a 64-position module, which is derived from a 289-position base module.
Figure 19:
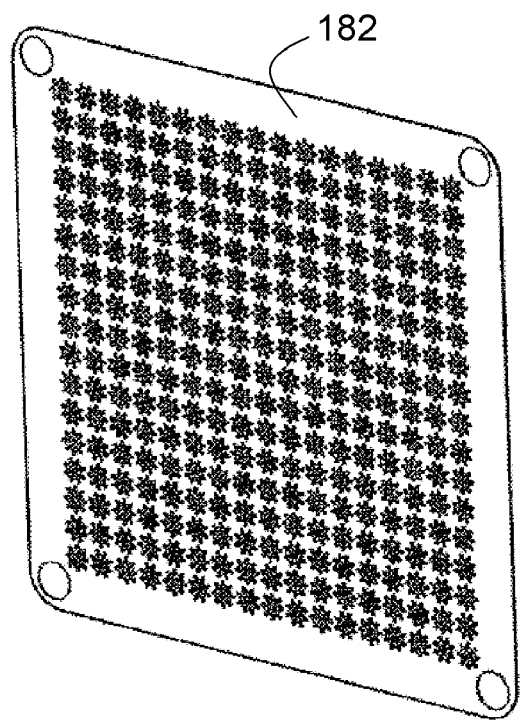
FIG. 19 is a plan drawing of the full 289-position module.

The assembly may be set up in an array form similar to the devices being tested. An array may be made with a standard amount of I/O, then the unused locations may either be etched or drilled off to match the I/O locations of the device being tested. For example, FIG. 18 is a plan drawing of a 64-position module 181, which is derived from a 289-position base module. FIG. 19 is a plan drawing of the full 289-position module 182.

The model that interfaces with the device under test is in a relatively small physical package and operates like as insert so it can fit into numerous housings including ones that are only slightly bigger than the assembly described above. By having the main interfacing mechanism to the device be an insert, it allows for rapid replacement of modules. Modules needing maintenance can be switched out in minutes, resulting in a decrease in tester downtime. Similar alignment holes in top and bottom contact plate and IPT may simplify replacement, as well.

A second alternative to the pie-shaped cantilever may be referred to informally as a "single coil spring inside two concentric tubes inside the via".

Figure 20:
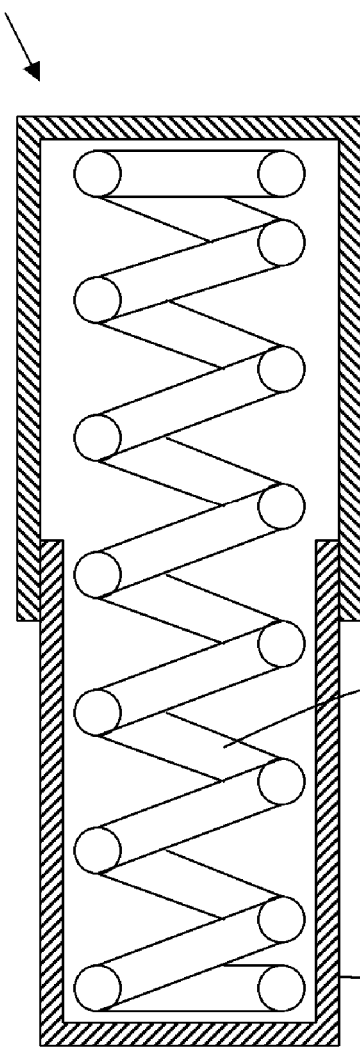
FIG. 20 is a cutaway drawing of a spring mechanism in an uncompressed state, where a device under test is disengaged from the test fixture.
Figure 21:
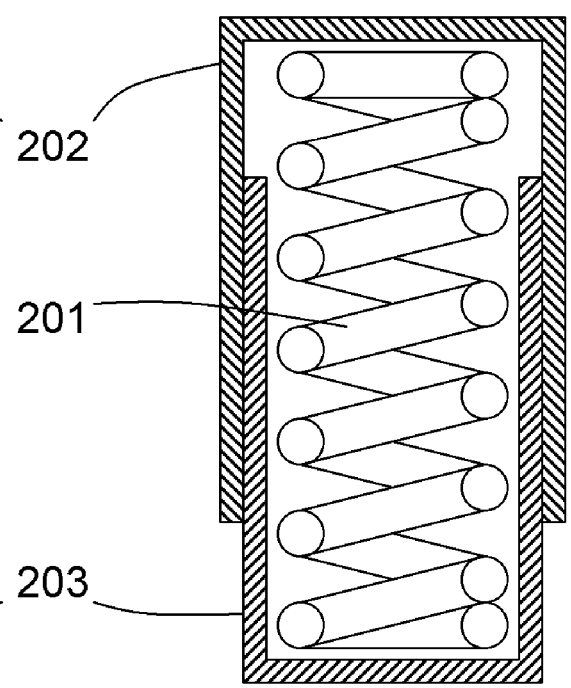
FIG. 21 is a cutaway drawing of the spring mechanism of FIG. 20 in a compressed state, where the device under test is fully engaged with the test fixture.

FIG. 20 is a cutaway drawing of a spring mechanism 200A in an uncompressed state, where a device under test is disengaged from the test fixture. FIG. 21 is a cutaway drawing of the same spring mechanism 200B in a compressed state, where the device under test is fully engaged with the test fixture.

In both cases, the device under test and terminal, the contact pad that contacts the terminal, and the load board and its connection pad are all similar in construction and function to those shown above.

FIGS. 20 and 21 shows a coil spring 201 inside two concentric tubes 202 and 203. The tubes 202 and 203 are both open-ended, with the open end of one fitting within the open end of the other. The tubes 202 and 203 can slide longitudinally with respect to each other, thereby changing the end-to-end length of the spring mechanism 200A, 200B. The spring mechanism is shown with a single coil spring 201, although more than one coil spring may be placed inside the tubes 202 and 203.

A potential advantage of placing the spring 201 inside the tubes 202 and 203 is that the wear that arises from repeated compressions and expansions of the spring may be confined to the overlapping portions of the tubes 202 and 203. Such a scheme may reduce wear or accidental contact of the spring with the inner wall of the via. A second potential advantage is that the tubes may reduce or eliminate any torques on the pads that might be formed at either end of the spring. A third potential advantage is that the tubes may be made from a conducting metal, and may assist the via wall in directing current to/from the terminal from/to the load board.

A potential disadvantage, if the tubes are electrically conductive, is that the resistance and/or inductance of the tubes may change, depending on how much the spring is compressed. For a particularly long terminal on the device under test, there may be a lot of spring compressed when the device under test is fully engaged with the test fixture. For a particularly short terminal, there may be less spring compression. This would lead to test results that vary with the terminal length and with the other tolerances in the device under test, which is also undesirable. In these cases, current may still be adequately carried by the via wall, which does not lead to tolerance-dependent results. In some cases, the pair of tubes may be electrical insulators.

In FIGS. 20 and 21, the tube 202 facing the device under test has a larger diameter than that of the tube 203 facing the load board. Alternatively, the tube 202 facing the device under test may have a smaller diameter than that of the tube 203 facing the load board.

In some applications, the spring mechanism 200A, 200B may be similar in design and in function to a toilet paper holder or paper towel holder, which confines a coil spring to a particular longitudinal axis and allows the spring to be compressed and/or expanded along that axis. It will be understood that in the test fixture, the pair of tubes does not necessarily hold any other elements in place, such as a roll of paper towels. Instead, the pair of tubes provides a housing for the coil spring, which may simplify the mechanical requirements of the interfaces at the longitudinal ends of the spring, and may desirably confine wear to the interface between the overlapping tubes, rather than the inside of the via.

A third alternative to the pie-shaped cantilever may be referred to informally as a "single coil spring with a conducting ribbon inside the via".

Figures 22, 23, 24:
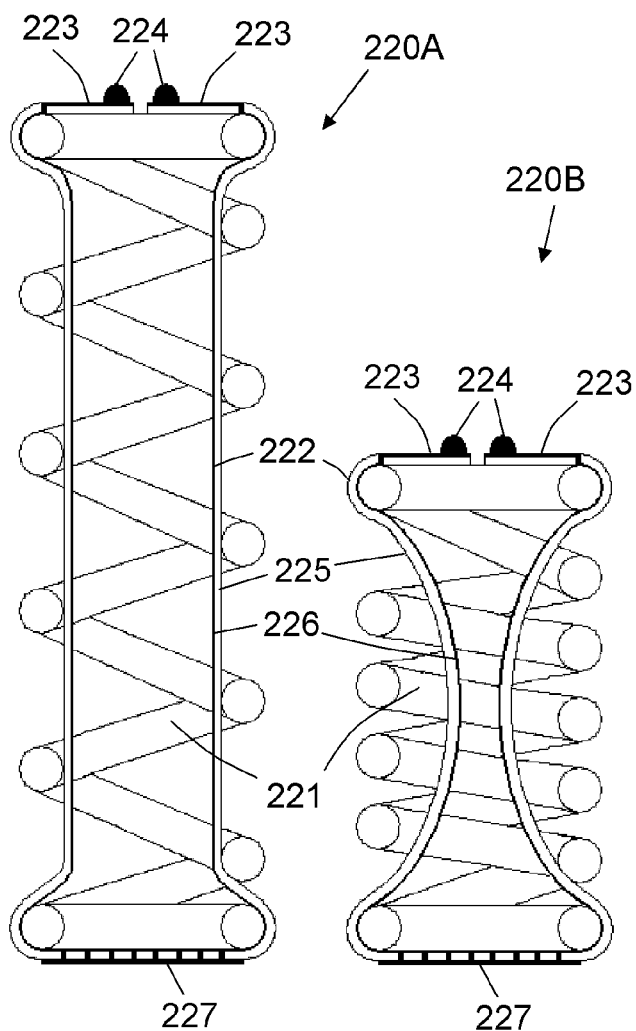
FIG. 22 is a side-view drawing of a spring mechanism in the uncompressed state.
FIG. 23 is a side-view drawing of the spring mechanism of FIG. 22, in the compressed state.
FIG. 24 is a top-view drawing of the spring mechanism of FIGS. 22 and 23.

FIG. 22 is a side-view drawing of a spring mechanism 220A in the uncompressed state. FIG. 23 is a side-view drawing of the spring mechanism 220B of FIG. 22 in the compressed state. FIG. 24 is a top-view drawing of the spring mechanism 220 of FIGS. 22 and 23, in either the compressed or uncompressed states.

The spring mechanism 220 includes a coil spring 221, which provides the mechanical properties of the spring mechanism, as well as a ribbon conductor 222, which provides an electrically conductive path from the top to the bottom of the spring mechanism 220. The flexible ribbon is allowed to bend inside the spring, keeping the same electrical path length the device terminal and the load board pad.

The ribbon conductor 222 is outside the coil spring 221 at the top and bottom of the coil spring, is woven through spaces the coil spring 221 near the top and bottom ends, and remains inside the coil spring 221 for the remaining length of the coil spring 221.

As the coil spring 221 flexes and changes length, the ribbon conductor 222 bows inward, near the center of the coil spring 221. Note that the ribbon conductor 222 remains the same length, regardless of the amount of spring compression. In turn, the electrical properties of the ribbon conductor 222, such as resistance and inductance, which depend on the electrical path length through the ribbon conductor 222, are independent of the amount of spring compression. This is a potential advantage of using the ribbon conductor 222 in the spring mechanism 220.

Note that FIGS. 22 and 23 show only one cross-sectional view of the spring mechanism 220A and 220B. In practice, the spring mechanism is three dimensional. As a result, the ribbon conductor 222 may not be a single strip, but may be shaped like all or a portion of a waffle ball, with many strips that run top-to-bottom along the spring, with the strips being joined at the top and/or the bottom of the spring. The strips may vary in width along their length, or may have continuous widths along their length.

The ribbon conductor 222 may be formed with a conductive surface 225 on its outer face and an insulating surface on its inner face 226, which may help reduce or prevent short circuits when the spring 221 is compressed. Alternatively, the locations of the conductive and insulating surfaces may be switched, so that the insulating surface appears on the outward-facing surface and the conducting surface appears on the inward-facing surface. For this switched orientation, there is typically an additional insulating surface placed over the conductive surface, also facing inward, so that the inner surfaces of the ribbon do not short out if they touch each other when the spring is compressed. This forms a sandwich-like structure for the ribbon, with a pair of insulating surfaces surrounding a conducting surface.

The ribbon conductor 222 connects electrically to a contact pad 223 on its top surface, which contacts the terminal of the device under test during use. The contact pad 223 may optionally include one or more bumps 224 that may enhance electrical contact and may desirably help scrape off any oxide layers on the terminal that would otherwise inhibit a good electrical connection. The ribbon conductor 222 also connects electrically to a contact pad 227 on its bottom surface, which contacts a connection pad on the load board during use.

The spring mechanism 220 may be constructed as follows. The ribbon conductor, or flexible circuit on membrane, may be first soldered, epoxied, or welded to the spring, then wrapped inside spring at or near the bottom spring turn. During use, as the spring compresses to get the needed Z-compliance the circuit on the flexible membrane would bow to take up space inside the spring, but not change its length, thereby keeping the same length electrical path. There may be two, four, six, eight, or any other suitable number of electrical paths routed from the top side of the membrane on the top of spring to the bottom load board interface side.

Figure 25:
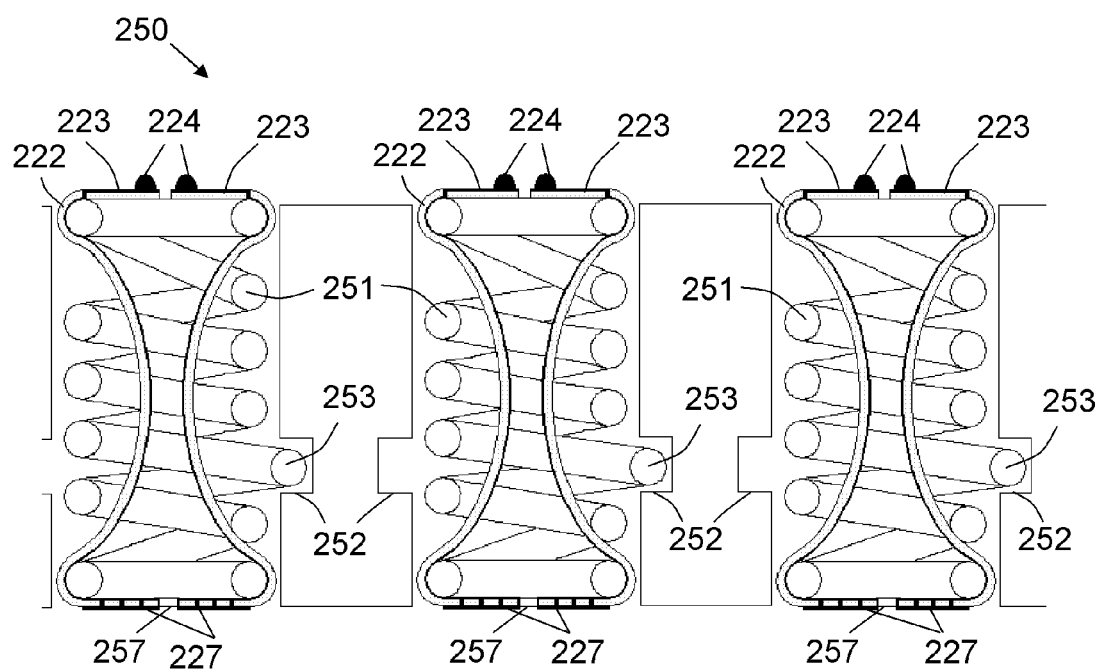
FIG. 25 is a side-view drawing of a spring mechanism that uses an enlarged turn of the spring to anchor the spring to a ridge in the via wall.

FIG. 25 is a side-view drawing of a spring mechanism 250 that uses an enlarged turn 253 of the spring 251 to anchor the spring 251 to a ridge 252 in the via wall.

In some cases, the enlarged turn 253 and ridge 252 are at or close to the top of the spring. In other cases, they are at or near the bottom of the spring 251. In still other cases, they are near the center of the spring 251. In yet other cases, they are away from the top, middle and bottom of the spring 251.

In some cases, the ridge 252 is formed by first forming the via with a ridge, then hollowing out a portion of the via wall to form the ridge. In other cases, the via wall may be formed in layers, the layers being parallel to the load board. In this layered construction, the ridge may be formed between two layers, or may be its own dedicated layers or dedicated layers.

Note that contact pad 227 can optionally be separated into two separate pads, creating isolated, separate paths from the contact pad 227 to the load board interface, which demonstrates a Kelvin connection. Element 257 is a non-conductive portion of the substrate material which separates the pads. The substrate may be made from a thin film of polyimide, commercially available from Dupont, such as ½-mil copper-plated Kapton, which is then plated with a nickel barrier and a gold coating to prevent oxidation and enhance electrical contact.

Figure 26:
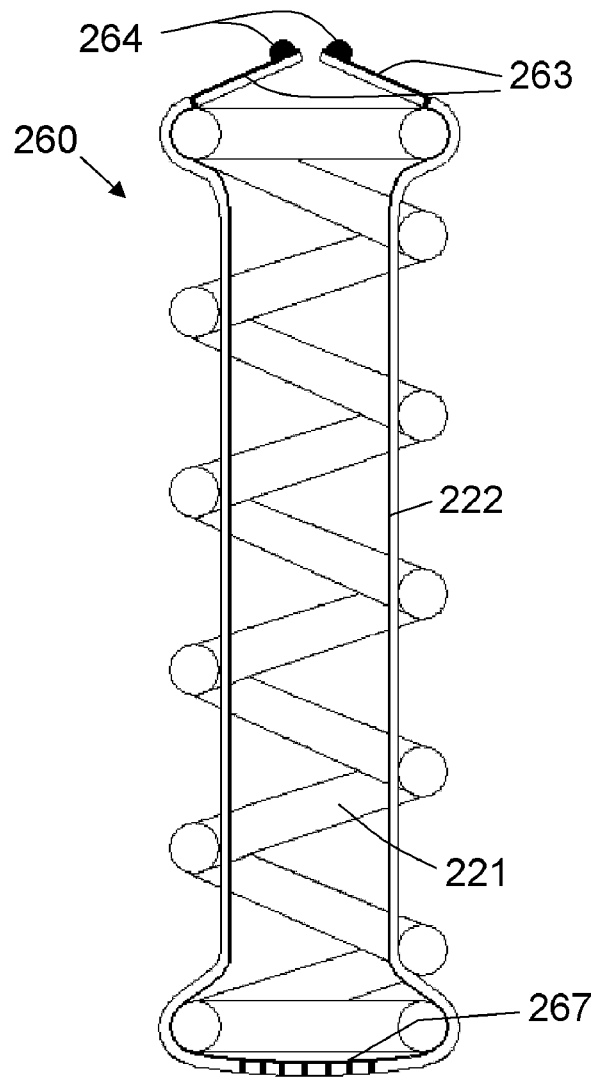
FIG. 26 is a side-view drawing of a spring mechanism in the uncompressed state, in which a ribbon conductor flexes away from the spring at the top and bottom of the spring mechanism 260.

FIG. 26 is a side-view drawing of a spring mechanism 260 in the uncompressed state, in which a ribbon conductor 222 flexes away from the spring 221 at the top and bottom of the spring mechanism 260. On the top side, facing the device under test, a contact pad 263 and bump 264 flex away from the spring mechanism 260, toward the device under test. On the bottom side, facing the load board, the ribbon conductor 222 flexes away from the spring mechanism 260 at the contact pad 267. Note that the ribbon conductor 222 may bend around the spring 221 to add compliance to the load board interface.

In the compressed state, the spring mechanism 260 closely resembles the mechanisms 220B and 220 shown in FIGS. 23 and 24.

A potential advantage for the flexing longitudinal ends of the spring mechanism 260 is that the flexing creates even more compliance for the test fixture. The bottom portion can flex downward to still make contact even if load board is non-coplanar or warped, even though there may be no stiffeners underneath the board. In some cases, the springs 221 may fit inside a housing with holes or even an IPT, as described above.

Some other potential advantages to the springs and/or bumps are as follows. Thin copper-plated film in between two thin non-conductive materials may be used in the bend area to relieve stress. Chamfered and radiused holes may help form the contact plate bend and prevent material from yielding, thus increasing contact life. Spring in via hole can add extra path between top contact area and device interface and lower contact plate interfacing to load board. The spring can also just provide mechanical support and bias to both top and bottom contact plates. Bumps on top contact plate can be formed to different shapes by using standard wire bonding equipment and attachment techniques. Multiple wire bonds or stud bumps can be placed on top of each other to make the bump size higher and change area bumps scrub balls on device and at what height bumps first make contact with the device. These bumps can be placed strategically to create a wipe function on the device balls to break through the oxide layer and can be up to four mils high to improve concept operating range for BGA devices and possible LGA devices as well.

Figure 27:
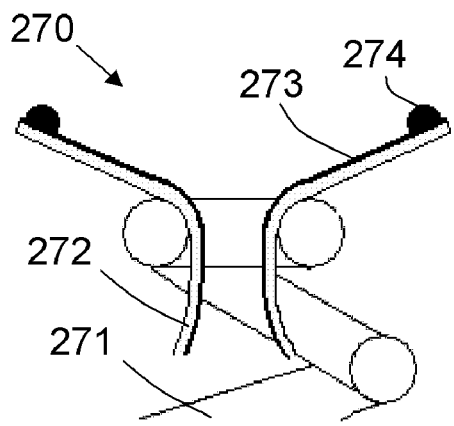
FIG. 27 is a side-view drawing of a spring mechanism in which the ends of a ribbon conductor extend outwardly from the inside of the top coil of a spring.

FIG. 27 is a side-view drawing of a spring mechanism 270 in which the ends 273 of a ribbon conductor 272, with bumps 274, extend outwardly from the inside of the top coil of a spring 271. The flexible fingers can be made more rigid with excessive plating. A funnel shape can help align the device to the contact array. Note that the flexible fingers can be bent outward to help align the terminals to the centers of the contacting mechanism. Note also that the configuration in FIG. 27 may be especially useful for testing devices that have ball terminals, such as BGAs.

Figure 28:
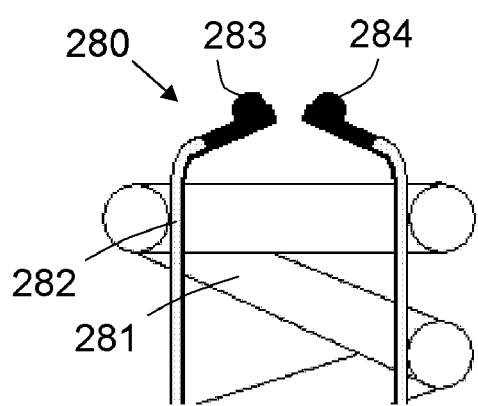
FIG. 28 is a side-view drawing of a spring mechanism in which the ends of a ribbon conductor extend inwardly from the outside of the top coil of a spring.

FIG. 28 is a side-view drawing of a spring mechanism 280 in which the ends 283 of a ribbon conductor 282, with bumps 284, extend inwardly from the outside of the top coil of a spring 281. This arrangement may help test devices having flat surfaces, such as pad or leaded devices. Note that the fingers flexing inward allows the fingers to perform a wiping action on the terminal, which can help remove any oxides from the terminal. Note also that the configuration in FIG. 28 may be especially useful for testing devices that have pads or leads, such as QFNs, MLFs and SLPs. Note finally that the inward-facing finger concept may be used as single pins, without necessarily having a full top and bottom contact membranes. This is also true for the configurations of FIGS.

25-27 and 36-38 as well, which may also use single pins rather than top and/or bottom contact plates.

Figure 39:
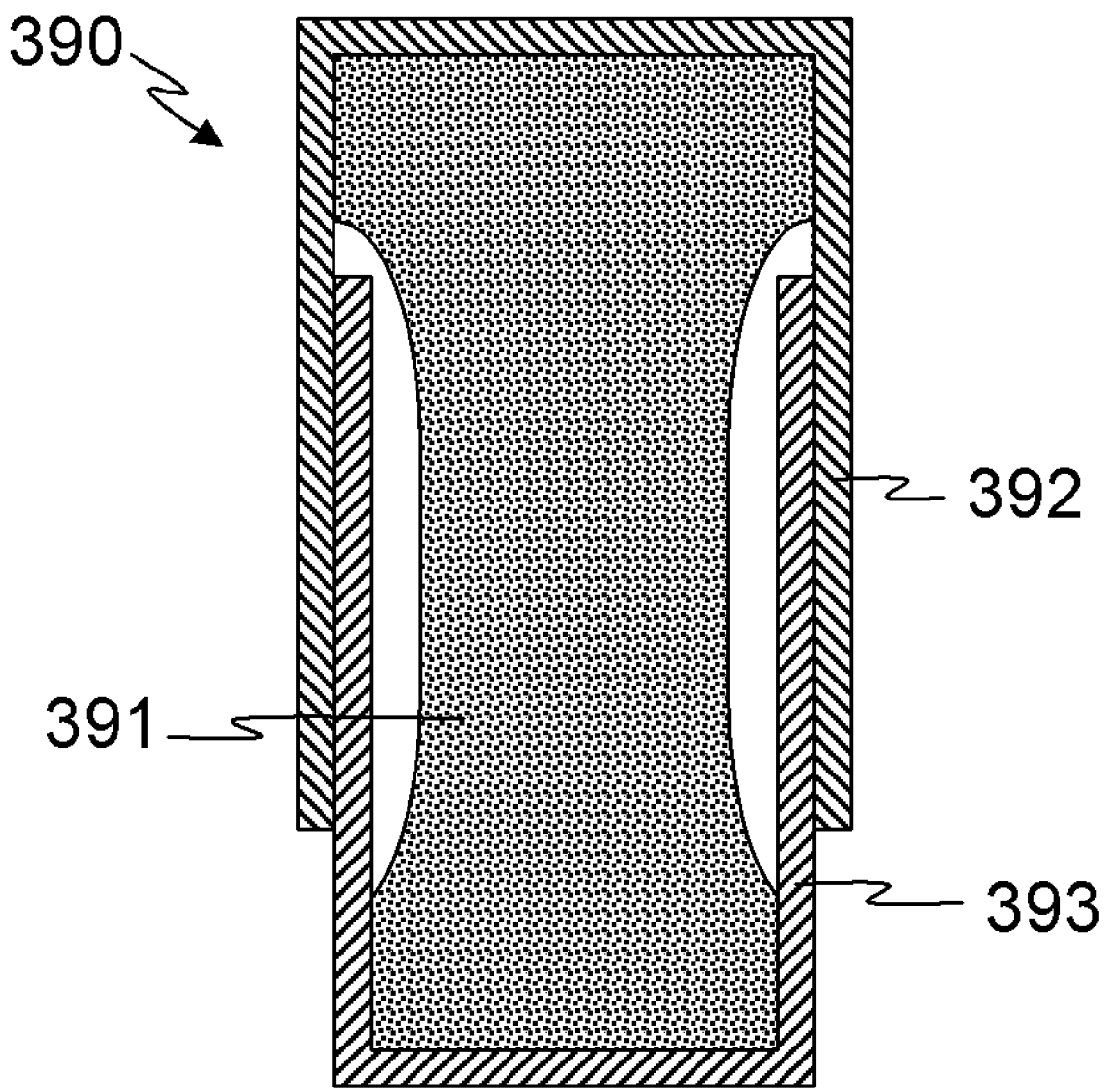
FIG. 39 is a cutaway drawing of a spring mechanism that uses a pair of nested, open-ended tubes and an elastomeric material.

Before proceeding to the fourth alternative to the pie-shaped cantilever, it is instructive to consider one final alternative spring mechanism 390 that uses the pair of open-ended tubes 392 and 393, but replaces the coil spring with an elastomeric material 391. Such a spring mechanism is shown in FIG. 39. An example of an elastomeric material, or elastic polymer, can be rubber, although any suitable elastomer may be used. For the purposes of this application, an elastomeric material is considered to be a spring element.

Note that the pair of tubes 392 and 393 confines the elastomer to reside inside the pair of tubes. There is some additional air space inside the tubes, which can allow for expansion of the material 391 during compression to keep forces manageable and allow for additional Z-compliance.

A fourth alternative to the pie-shaped cantilever may be referred to informally as a "leaf spring with a conducting ribbon inside the via".

Figure 29:
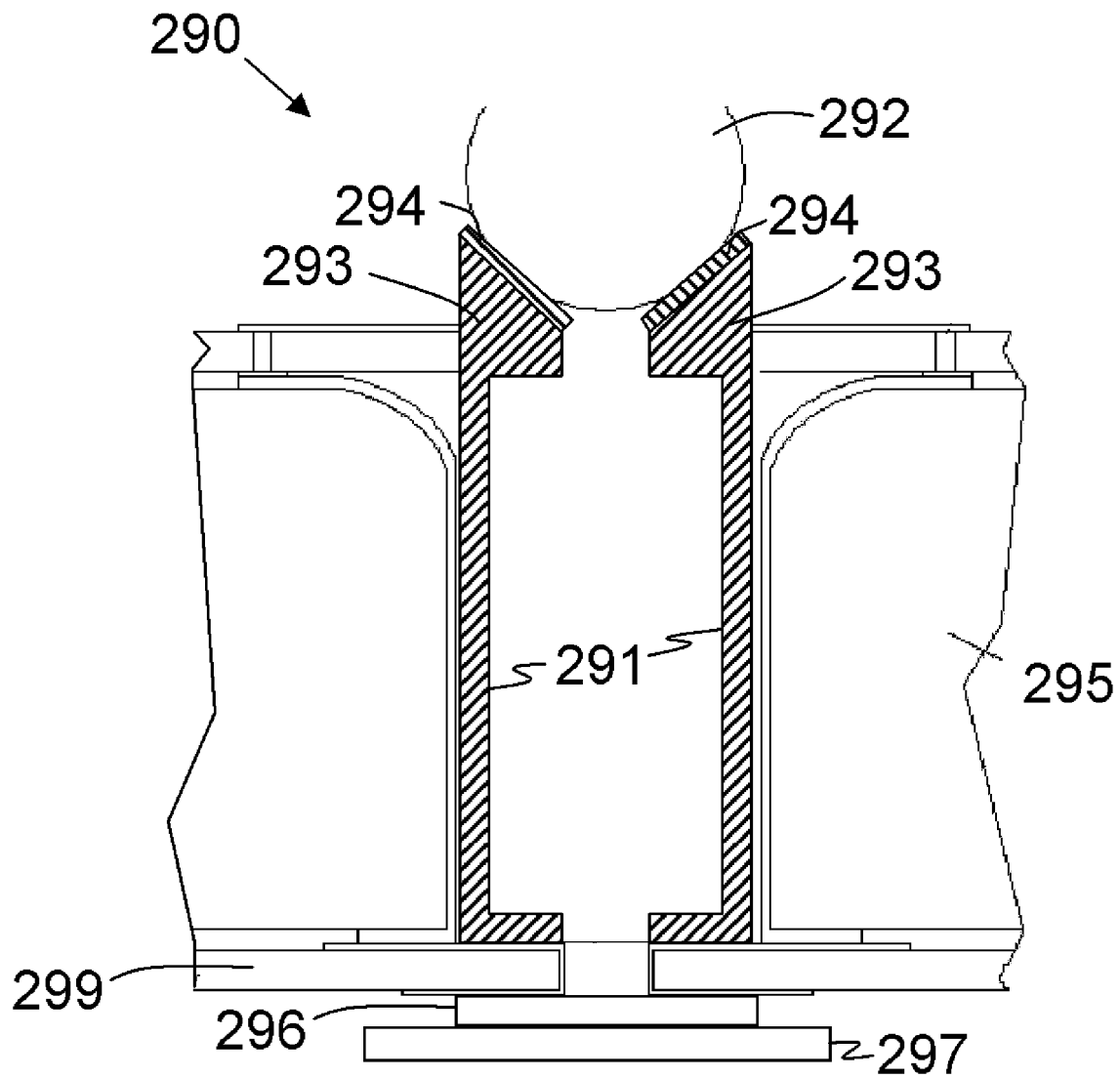
FIG. 29 is a side-view drawing of a leaf spring mechanism.

FIG. 29 is a side-view drawing of a leaf spring mechanism 290. A ball or terminal 292 on the device under test contacts the contact pad 293 and/or optional textures 294 on the contact pad. The textures may have a wiping mechanism for pad or leaded application, and may help break through any oxides to improve the electrical connection.

The contact pad 293 is disposed on the end of a leaf spring 291, which resides inside a via in the membrane 295. Opposite the device under test, the membrane contacts a contact pad 296 on the load board 297.

The leaf spring includes an optional self alignment mechanism, in which the contact pad 293 includes a local tilt away from being parallel to the load board. This local tilt forces the terminal 292 into more secure contact with adjacent pads 293.

Element 299 may be a bottom contact plate, which may help prevent debris from reaching the load board 297.

In FIG. 29, the leaf spring 291 is shown in the compressed state. When the spring is uncompressed, the arms with the contact pads 293 and bumps 294 open outward, similar to the pads in FIGS. 16 and 26, described above.

Alternatively, the leaf spring arms may extend radially outward, from the center of the via, rather than extending radially inward, as shown in FIG. 29.

In some cases, the leaf spring may be made from a conductive metal, and may conduct current to/from the terminal from/to the load board. In some cases, the leaf spring may be the sole current carrier through the via. In other cases, the leaf spring may conduct, along with the wall of the via. In still other cases, the wall of the via may be the sole electrical conductor through the via.

The following section describes various surface patterns that may be used on the contact pad closest to the terminal on the device under test. Any or all of these surface patterns may desirably help scrape away any oxide that may have formed on the terminal, and may therefore improve electrical contact between the device under test and the test fixture. Any or all of these surface patterns may be used with any or all of the spring mechanisms, contact pad configurations and bump configurations described above.

Figure 30:
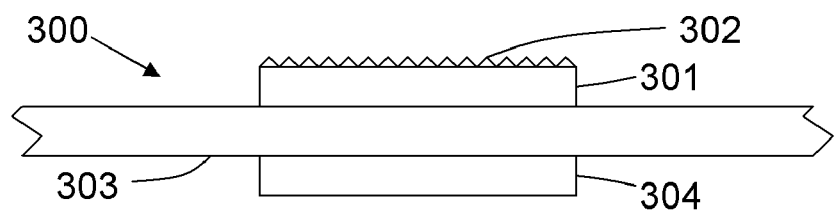
FIG. 30 is a side-view drawing of a portion of a test fixture that has a textured surface on the contact pad facing the device under test (not shown).

FIG. 30 is a side-view drawing of a portion of a test fixture 300 that has a textured surface 302 on the contact pad 301 facing the device under test (not shown). The textured contact pad 301 is formed on the top surface of a membrane 303. A corresponding contact pad 304 is formed on the bottom surface of the membrane 303, which may contact a corresponding contact pad on a second membrane or on the load board. The top and bottom contact pads 301 and 304 are in permanent electrical connection with each other, and may be electrically connected at one or more locations through the membrane 303.

Figure 31:
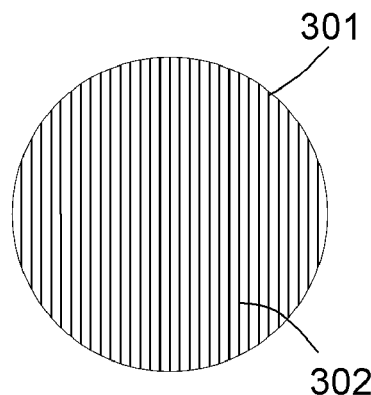
FIG. 31 is a top-view drawing of the contact pad of FIG. 30.

FIG. 31 is a top-view drawing of the contact pad 301 of FIG. 30. The contact pad 301 has a series of stripes or ridges 302. In some cases, the ridges 302 have angled sides and/or sharp angled corners, which may improve electrical contact with the device under test.

The ridges 302 may be formed by such methods as lasering a portion of the way into the metal pad, by selectively etching down into the pad, or by any other suitable method.

Figures 32, 33:
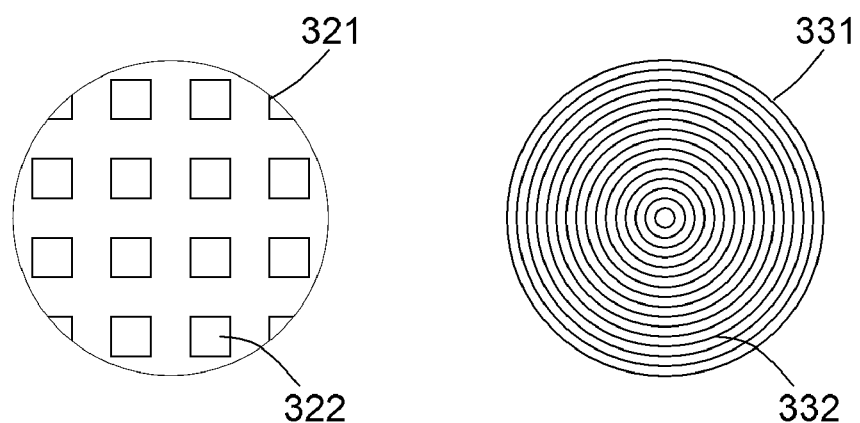
FIG. 32 is a top-view drawing of a contact pad having a textured surface with rectangular features.
FIG. 33 is a top-view drawing of another contact pad having a textured surface with concentric circular features.

FIG. 32 is a top-view drawing of another contact pad 321 having a textured surface with rectangular features 322. In some cases, the rectangles may be raised or lowered out of the plane of the contact pad 321. In other cases, the rectangles may have a pyramid-like shape, with portions that are non-parallel to the plane of the contact pad.

FIG. 33 is a top-view drawing of another contact pad 331 having a textured surface with concentric circular features 332. As with the rectangular design, one or more of the concentric circles may be raised or lowered out of the plane of the contact pad 331.

The three textured designs shown in FIGS. 30-33 are merely exemplary. In practice, any design that provides an angled surface and/or sharp angles on the surface that contacts a terminal on the device under test may be used.

In addition, any or all of the textured designs may be used on any of the contact pads shown above, including pads that include bumps, and the pads on the ends of the conductive ribbon.

As an alternative to providing portions of the contact pad that are angled, where the plane of the contact pad is generally parallel to the load board, it is possible to angle the entire contact pad. This provides a surface to have device balls rub against during insertion into the contactor.

Figure 34:
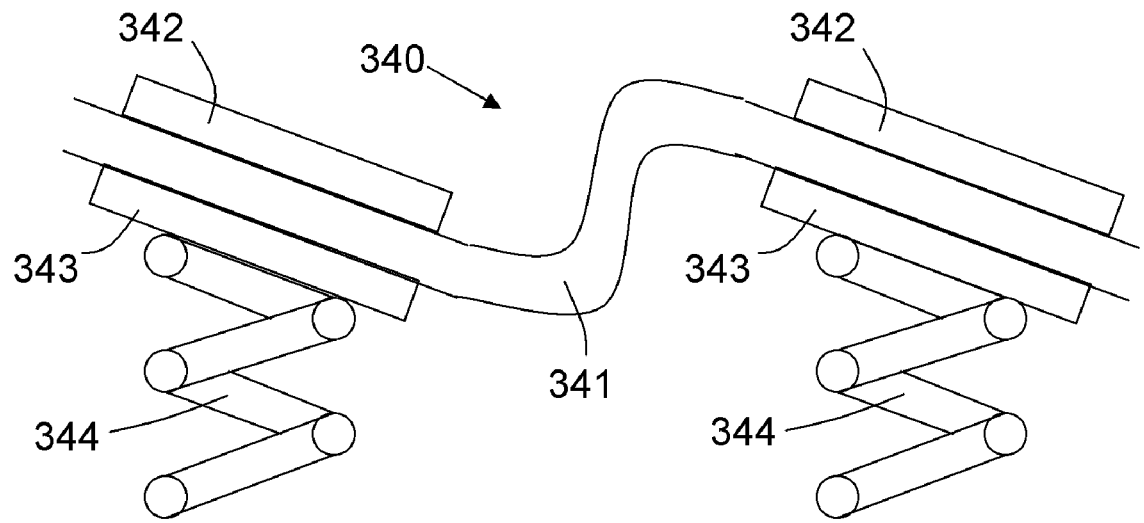
FIG. 34 is a side-view drawing of an exemplary test fixture that includes angled contact pads.

For instance, FIG. 34 is a side-view drawing of an exemplary test fixture 340 that includes angled contact pads 342. The test fixture includes a membrane 341 that deflects under the effects of spring 344. The ends of the springs 344 are deliberately angled at the contact pads 343, rather than being flat, as shown in earlier drawings, such as FIGS. 20 and 21.

Figure 35:
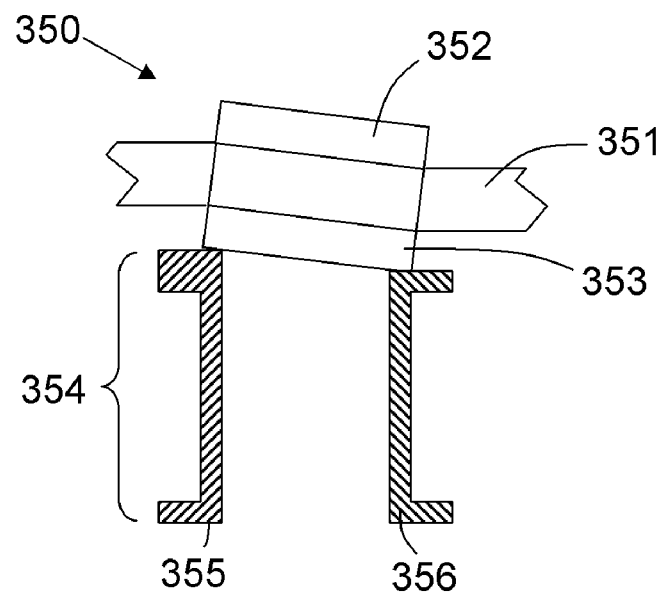
FIG. 35 is a side-view drawing of another exemplary test fixture that includes angled contact pads.

Another angled-pad design is shown in FIG. 35. In this exemplary test fixture 350, the membrane 351 bends or deforms slightly in the region of each via 354. Each via 354 is angled slightly, so that one side 355 extends farther toward the device under test than the opposite side 356. In practice, the via 354 may have a flat, but angled, interface at the bottom contact pad 353, which is shown only in cross-section in FIG. 35. As a result of this angled interface with the via 354, the contact pad 352, which contacts the terminal on the device under test (not shown) is also angled. In other cases, it is possible to form the angle by increasing the thickness on one side of the contact pad on the membrane, rather than on the via. Other combinations are possible as well.

Such an angled-pad design may be manufactured by removing material from one side of the via, such as by lasering or etching material away, and/or by adding material to the other side of the via using a plating process.

There may be one or more advantages to having an angled contact pad, as shown in the examples of FIGS. 34 and 35. For instance, when the terminal contacts the angled pad, there may be a sliding or scraping action, caused by "sliding down a slope" along the contact pad, which may help break through and/or scrape away any oxides that have built up on the terminal. This, in turn, improves electrical contact at the terminal. In addition, this self-cleaning wiping action may help push the scrape-away oxides from the contact surface, thereby increasing the mean time between cleanings of the top contact plate.

Figure 36:
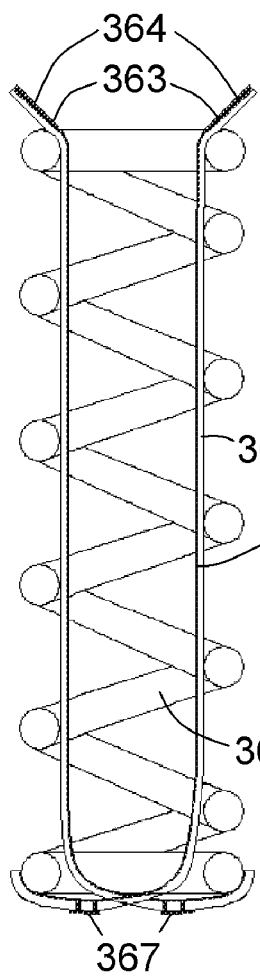
FIG. 36 is a side-view drawing of a spring mechanism in the uncompressed state.
Figure 37:
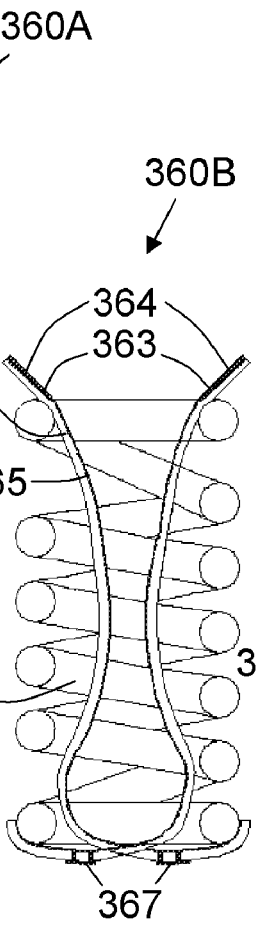
FIG. 37 is a side-view drawing of the spring mechanism of FIG. 36, in the compressed state.
Figure 38:
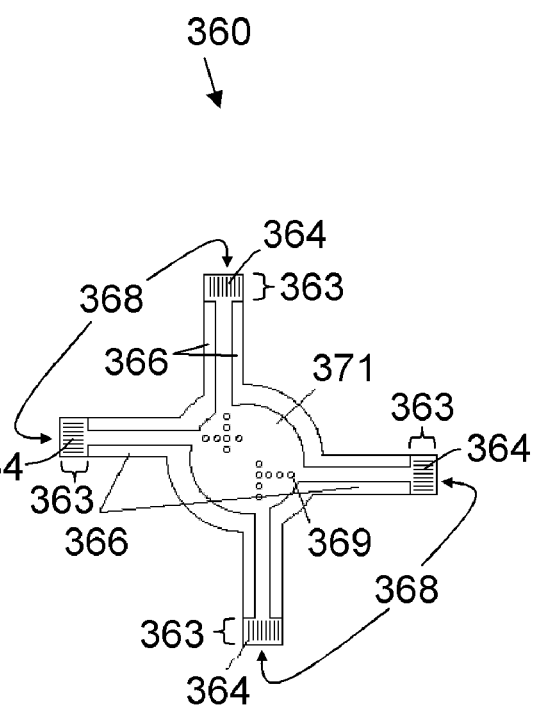
FIG. 38 is a top-view drawing of the ribbon conductor of FIGS. 36 and 37.

Finally, we describe one more alternative for the ribbon conductor, first shown in FIGS. 22-28. FIG. 36 is a side-view drawing of a spring mechanism 360A in the uncompressed state. FIG. 37 is a side-view drawing of the spring mechanism 360B of FIG. 36, in the compressed state. FIG. 38 is a top-view drawing of the ribbon conductor 360 of FIGS. 36 and 37.

The spring mechanism 360A and 360B includes a coil spring 361, which provides the mechanical properties of the spring mechanism, as well as a ribbon conductor 362, which provides an electrically conductive path from the top to the bottom of the spring mechanism 360A and 360B.

The ribbon conductor 362 is outside the coil spring 361 at the bottom of the coil spring (adjacent to the load board), is woven through spaces the coil spring 361 near the bottom ends, and remains inside the coil spring 361 for the remaining length of the coil spring 361. The contact pads 363 may emerge outward through the top coil in the spring 361, as shown in FIGS. 36 and 27, or may alternatively emerge inward around the top coil of the spring, as in FIG. 28.

In general, the configuration of the top contact pads, adjacent to the device under test, depends on what kind of device is being tested, such as BGA devices with balls, or QFN or SOP devices with pads or flat leads.

The ribbon conductor 362 connects electrically to a contact pad 363 on its top surface, which contacts the terminal of the device under test during use. The contact pad 363 may optionally include one or more bumps or textures 364 that may enhance electrical contact and may desirably help scrape off any oxide layers on the terminal that would otherwise inhibit a good electrical connection. The ribbon conductor 362 also connects electrically to one or more contact pad 367 on its bottom surface, which contacts a connection pad on the load board during use.

Note that the contact pads 363 and 367 are on opposite sides of the conductor 362. They may be connected electrically through the conductor 362, through one or more vias 369. The vias may optionally be located in areas of reduced stress in the conductor 362, which may desirably prolong the life of the conductor 362.

Note that the ribbon conductor 362 may have a controlled impedance in any or all of the arms or strands 368, and/or in the base 371. In some cases, this controlled impedance may match that of adjacent electrical components, which may reduce reflected losses and may therefore improve the electrical performance of the conductor 362.

The conductor 362 is drawn in FIG. 38 as having four arms 368, each being 90 degrees apart, azimuthally. Alternatively, there may be two, three, five, six, seven, eight, or more than eight arms 368.

In some cases, each arm 368 may have a conducting portion, denoted by base 371 and its surrounding area, and an insulating area, denoted by non-contiguous areas 366. In some cases, a pair of opposite arms may has a transverse offset with respect to each other, so that if the opposite arms do contact each other during use, when the spring 362 is compressed, then the electrically conductive areas 371 of opposite arms do not touch each other. For arms with this transverse offset, a conductive area of one arm may contact an insulating area of the opposite arm without significant negative effects.

In some cases, the conductor, or membrane, 362 is made as one piece. In other cases, the conductor is fabricated as multiple strips that are adhered to opposite side of the spring 361 on the bottom to allow for maximum flexing of the membrane substrate.

In some cases, the membrane could be completely plated for higher current applications or could be a designed control impedance line that matches the device under test. In some cases, the top portion of the membrane could include grooves, which may enhance electrical contact with the terminal of the device under test. Such enhancement may include a wipe function to remove oxides. The grooves may be cut into the membrane, or plated as beam in the membrane to provide a sharp bevel to remove the oxides.

Note that this ribbon conductor 362 keeps the same electrical path length, regardless of the compression level of the spring 362. This is advantageous, compared to running current through the spring itself, because the electrical properties of the conductor 362 do not vary with the compression level of the spring 362.

In some cases, a plating on the side of membrane could also be used to add more current capability or provide shielding. If two or multiple strips are used and not tied to each other or to conducting spring two separate paths are generated from device to load board for Kelvin (Force or sense) applications and would contact separate load board pads.

The description of the invention and its applications as set forth herein is illustrative and is not intended to limit the scope of the invention. Variations and modifications of the embodiments disclosed herein are possible, and practical alternatives to and equivalents of the various elements of the embodiments would be understood to those of ordinary skill in the art upon study of this patent document. These and other variations and modifications of the embodiments disclosed herein may be made without departing from the scope and spirit of the invention.

We claim:

1. A test receptacle (30) for making temporary electrical contact with a plurality of microcircuit terminals (20) having a predetermined pattern, comprising:
a test contact element array (40) comprising a plurality of test contact elements (56-58) arranged in substantially the predetermined pattern of the plurality of microcircuit terminals (20), each test contact element (56-58) in the plurality comprising a resilient finger (56a, 56b, 57a, 57b, 58a, 58b) projecting from an insulating membrane (50) as a cantilevered beam, and having on a contact side thereof a conducting contact pad (63a, 63b, 64a, 64b, 65a, 65b) for contacting a corresponding microcircuit terminal (20) in the plurality;
a plurality of connection vias (83-85) arranged in substantially the predetermined pattern of the plurality of microcircuit terminals (20), each connection via (83-85) in the plurality aligned with one of the test contact elements (56-58);
an interface membrane (80) supporting the plurality of connection vias (83-85);
wherein at least one of the connection vias (83-85) is cup-shaped with an open end, with the open end of the cup-shaped via (83-85) contacting a corresponding test contact element (56-58).

2. The test receptacle (30) of claim 1, wherein the test contact element (56-58) comprises a plurality of adjacent fingers, each projecting from an insulating membrane (50) as a cantilevered beam, and each having on a contact side thereof a conducting layer for contacting the microcircuit terminal (20).

3. The test receptacle (30) of claim 2, wherein each of the plurality of adjacent fingers (56a, 56b, 57a, 57b, 58a, 58b) is tapered and is arranged in a pie shape.

4. The test receptacle (30) of claim 3, wherein a membrane (50) supports the outer ends of the fingers (56a, 56b, 57a, 57b, 58a, 58b).

5. The test receptacle (30) of claim 4, wherein the fingers are (56a, 56b, 57a, 57b, 58a, 58b) integral with the membrane (50).

6. The test receptacle (30) of claim 5, wherein each finger (56a, 56b, 57a, 57b, 58a, 58b) is defined at least in part by two slots (62) in the membrane (50) mechanically separating each finger from every other finger (56a, 56b, 57a, 57b, 58a, 58b) of the plurality of fingers (56a, 56b, 57a, 57b, 58a, 58b) forming the test contact element (56-58).

7. The test receptacle (30) of claim 6, wherein each slot (62) is radially oriented.

8. The test receptacle (30) of claim 6, wherein at least one slot (62) has an enlargement at the base thereof.

9. The test receptacle (30) of claim 6, wherein each finger (56a, 56b, 57a, 57b, 58a, 58b) has on the side of the finger (56a, 56b, 57a, 57b, 58a, 58b) opposite the contact side, a connection pad.

10. The test receptacle (30) of claim 9, wherein the contact pad (63a, 63b, 64a, 64b, 65a, 65b) and the connection pad on at least one of the individual fingers (56a, 56b, 57a, 57b, 58a, 58b) are electrically connected.

11. The test receptacle (30) of claim 10, wherein the at least one of the individual fingers (56a, 56b, 57a, 57b, 58a, 58b) has a conductive layer defining at least a part of the side of the adjacent slot (62), said conductive layer in electrical connection with the contact pad (63a, 63b, 64a, 64b, 65a, 65b) and the connection pad.

12. The test receptacle (30) of claim 6, wherein at least one finger (56a, 56b, 57a, 57b, 58a, 58b) has a number of teeth (88) on the contact pad.

13. The test receptacle (30) of claim 12, with the teeth (88) arranged in a linear pattern extending along at least one edge of the contact pad defined by a slot (62).

14. The test receptacle (30) of claim 1 including a load board (47) having a plurality of connection pads (91-93) in substantially the predetermined pattern of the test contact elements (56-58), said load board (47) supporting the interface membrane (80) with each of the connection pads (91-93) substantially aligned with one of the connection vias (83-85) and in electrical contact therewith.

15. The test receptacle (30) of claim 1, further comprising in a via, an internal spring pressing against at least one of the fingers (56a, 56b, 57a, 57b, 58a, 58b) of the test contact.

16. A test fixture for forming a plurality of temporary mechanical and electrical connections between a device under test (10) having a plurality of terminals (20) and a load board (47) having a plurality of connection pads (91-93), the terminals (20) and connection pads (91-93) being in a one-to-one correspondence, comprising:
a replaceable interface membrane (80) disposed generally parallel to and adjacent to the load board (47),
the interface membrane (80) including a plurality of vias (83-85) in a one-to-one correspondence with the plurality of connection pads (91-93) of the load board (47), each via (83-85) being cup-shaped with a base adjacent to a corresponding connection pad (91-93) on the load board (47) and a rim extending away from the load board (47); and
a replaceable contact membrane (50) disposed generally parallel to and adjacent to the interface membrane (80),
the interface membrane (80) being between the load board (47) and the contact membrane (50),
the contact membrane (50) including a plurality of connection pads (75) facing the interface membrane (80), each via (83-85) on the interface membrane (80) corresponding to at least one connection pad (75) on the contact membrane (50),
the contact membrane (50) including a plurality of contact pads (56-58) facing away from the interface membrane (80), each contact pad (56-58) in the plurality being permanently electrically connected to at least one of the plurality of connection pads (75), each via (83-85) on the interface membrane (80) corresponding to at least one contact pad (56-58) on the contact membrane (50);
wherein each contact pad (56-58) corresponding to a particular via (83-85) is configured to mechanically and electrically receive the terminal (20) on the device under test (10) corresponding to the particular via (83-85); and
wherein when the device under test (10) is attached to the test fixture,
the interface membrane (80) contacts the load board (47),
the contact membrane (50) contacts the interface membrane (80), and
the plurality of terminals (20) on the device under test (10) are electrically connected in a one-to-one correspondence to the plurality of connection pads (91-93) on the load board (47).

17. The test fixture of claim 16, wherein the interface membrane (80) is separated from the load board (47) when the device under test (10) is detached from the test fixture.

18. The test fixture of claim 16, wherein the contact membrane (50) is separated from the interface membrane (80) when the device under test (10) is detached from the test fixture.

19. The test fixture of claim 16, wherein when the device under test (10) is attached to the test fixture, the electrical connection between each terminal (20) on the device under test (10) and each corresponding connection pad (91-93) on the load board (47) includes a path through a wall of the corresponding via (83-85).

20. The test fixture of claim 16, wherein the plurality of connection pads (75) on the contact membrane (50) has a one-to-one correspondence with the plurality of contact pads (56-58) on the contact membrane (50).

21. The test fixture of claim 20,
wherein each connection pad (75) and corresponding contact pad (56-58) forms a cantilevered beam;
wherein each cantilevered beam is attached to the contact membrane (50) at a fixed end and is free at a free end opposite the fixed end;
wherein the free end of each beam is elastically deflectable out of the plane the contact membrane (50).

22. The test fixture of claim 21, wherein when the device under test (10) is attached to the test fixture, the corresponding terminal (20) on the device under test (10) deflects the free end of each beam and forces an electrical contact proximate the fixed end between the connection pad (75) and a wall of the corresponding via (83-85).

23. A test fixture (120) for forming a plurality of temporary mechanical and electrical connections between a device under test (130) and a load board (160), comprising:
a membrane (150) for mechanically and electrically contacting the load board (160);
a plurality of vias (151) disposed in the membrane (150), each via (151) in the plurality being associated with a terminal (131) on the device under test (130) and a contact pad (161) on the load board (160), each via (151) in the plurality having an electrically conducting wall for conducting current between the terminal (131) and the contact pad (161); and a plurality of springs (152) disposed within the plurality of vias (151) in a one-to-one correspondence, each spring (152) in the plurality providing a mechanical resisting force to the terminal (131) when the device under test (130) is engaged with the test fixture (120).

24. The test fixture (120) of claim 23, further comprising:
a contact membrane (140);
a top contact pad (141) disposed on a first side of the contact membrane (140) for directly contacting electrically the terminal (131); and
a bottom contact pad (142) disposed on a second side of the contact membrane (140) opposite the first side, for directly contacting the electrically conducting wall of the via (151);
wherein the top contact pad (141) and the bottom contact pad (142) are permanently electrically connected.

25. The test fixture (120) of claim 24, wherein the top contact pad (141) comprises a plurality of arms, each arm in the plurality having a fixed end and a free end, the free end extending generally radially inward from a periphery adjacent to the wall of the via (151), the free end being generally longitudinally deflectable by the terminal (131).

26. The test fixture (120) of claim 24, wherein the top contact pad (141) includes at least one bump for contacting the terminal (131), the at least one bump extending out of the plane of the top contact pad (141).

27. The test fixture (120) of claim 24, wherein the top contact pad (301) includes a non-planar texture (302, 322, 332).

28. The test fixture (120) of claim 27, wherein the non-planar texture (302) has a striped configuration.

29. The test fixture (120) of claim 27, wherein the non-planar texture (322) has a rectangular configuration.

30. The test fixture (120) of claim 27, wherein the non-planar texture (332) has a concentric circular configuration.

31. The test fixture (120) of claim 24, wherein the top contact pad (342, 352) is not parallel to the load board (160) when the device under test (130) is engaged with the test fixture (120).

32. The test fixture (120) of claim 24, wherein the top contact pad (342) deflects away from parallel under the action of the spring (344).

33. The test fixture (120) of claim 24, wherein the top contact pad (352) deflects away from parallel by contacting an angled via (354).

34. The test fixture (120) of claim 23, wherein each via (151) is cup-shaped and has an open end facing the device under test (130).

35. The test fixture (120) of claim 23, wherein at least one spring (251) in the plurality includes an enlarged turn (253) of the spring (251) that anchors the spring (251) to a ridge (252) in the wall of the via (151).

36. The test fixture (120) of claim 23, wherein the membrane (150) is replaceable, independent of the load board (160).

37. A test fixture (120) for forming a plurality of temporary mechanical and electrical connections between a device under test (130) and a load board (160), comprising:
a membrane (150) for mechanically and electrically contacting the load board (160);
a plurality of vias (151) disposed in the membrane (150), each via (151) in the plurality being associated with a terminal (131) on the device under test (130) and a contact pad (161) on the load board (160);
a plurality of spring elements (201, 391) disposed within the plurality of vias (151) in a one-to-one correspondence, each spring element (201, 391) in the plurality providing a mechanical resisting force to the terminal (131) when the device under test (130) is engaged with the test fixture (120); and
a pair of open-ended tubes (202, 203, 392, 393), the open end of one tube (203, 393) fitting within the open end of the other tube (202, 392), the tubes being longitudinally slidable with respect to each other, the tubes (202, 203, 392, 393) surrounding and housing the spring element (201, 391).

38. The test fixture (120) of claim 37, wherein the pair of tubes (202, 203, 392, 393) are electrically conducting and conduct current between the terminal (131) and the contact pad (161).

39. The test fixture (120) of claim 37,
wherein the pair of tubes (202, 203) are electrically insulating; and
wherein each via (151) in the plurality has an electrically conducting wall for conducting current between the terminal (131) and the contact pad (161).

40. The test fixture (120) of claim 37, wherein the spring element (201) is a coil spring.

41. The test fixture (120) of claim 37, wherein the spring element (391) is an elastomeric material.

42. A test fixture (120) for forming a plurality of temporary mechanical and electrical connections between a device under test (130) and a load board (160), comprising:
a membrane (150) for mechanically and electrically contacting the load board (160);
a plurality of vias (151) disposed in the membrane (150), each via (151) in the plurality being associated with a terminal (131) on the device under test (130) and a contact pad (161) on the load board (160);
a plurality of springs (221) disposed within the plurality of vias (151) in a one-to-one correspondence, each spring (221) in the plurality providing a mechanical resisting force to the terminal (131) when the device under test (130) is engaged with the test fixture (120); and
a plurality of electrically conducting ribbons (222) in a one-to-one correspondence with the plurality of vias (151), each ribbon (222) configured for conducting current between the corresponding terminal (131) and the corresponding contact pad (161), each ribbon (222) including at least one strand interwoven with the corresponding spring (221) and electrically connecting a first longitudinal end of the corresponding spring (221) to a second longitudinal end opposite the first longitudinal end.

43. The test fixture (120) of claim 42, wherein each electrically conducting ribbon (222) in the plurality comprises an electrically conducting surface (225) that faces radially outward and an electrically insulating surface (226) that faces radially inward.

44. The test fixture (120) of claim 43, wherein each strand of each electrically conducting ribbon (222) in the plurality extends to a cantilevered arm (223) at the longitudinal end facing the device under test (130).

45. The test fixture (120) of claim 42, wherein each electrically conducting ribbon (222) in the plurality comprises a pair of electrically insulating surfaces that face radially inward and outward, respectively, and an electrically conducting surface disposed between the pair of insulating surfaces.

46. A test fixture for forming a temporary mechanical and electrical connection between a terminal of a device under test and a contact pad of a load board, comprising:
- a compressible spring (361) for providing a longitudinal resisting force between the terminal on the device under test and the contact pad of the load board when the device under test engaged with the test fixture; and
- a ribbon conductor (362) for conducting current between the terminal on the device under test and the contact pad of the load board, the ribbon conductor (362) comprising a plurality of conductive strands (368);
- wherein each strand (368) in the plurality:
    - extends along a longitudinal extent of the spring (361);
    - is electrically connected to the other strands (368) in the plurality;
    - terminates in a contact pad (363) for mechanically and electrically contacting the terminal on the device under test; and
    - has an electrical path length that is invariant with respect to the compression of the spring (361).

47. The test fixture of claim 46, wherein each strand (368) in the plurality is equally spaced azimuthally from adjacent strands (368) in the plurality.

48. The test fixture of claim 46, wherein each strand (368) in the plurality is laterally offset from opposite strands (368) in the plurality.

49. The test fixture of claim 46, wherein each strand (368) in the plurality comprises an electrically conducting portion (371) laterally surrounded by an electrically insulating portion (366).

50. The test fixture of claim 46, wherein the plurality of strands (368) comprises two strands.

51. The test fixture of claim 46, wherein the plurality of strands (368) comprises four strands.

52. The test fixture of claim 46, wherein the plurality of strands (368) comprises six strands.

53. The test fixture of claim 46, wherein each strand (368) in the plurality is electrically connected at a common base, the common base being at the opposite end of each strand (368) as the contact pad (363).

54. The test fixture of claim 53, wherein the common base is electrically connected to at least one load board contact pad (367) by at least one via (369) through the ribbon conductor (362).

55. The test fixture of claim 46, wherein each contact pad (363) comprises a textured surface (364).

56. The test fixture of claim 55, wherein each textured surface (364) comprises a plurality of grooves.

57. The test fixture of claim 55, wherein each textured surface (364) comprises at least one bump extending out of the plane of the contact pad (363).

* * * * *